US008440977B2

(12) United States Patent
Ishii et al.

(10) Patent No.: US 8,440,977 B2
(45) Date of Patent: May 14, 2013

(54) MANUFACTURING METHOD OF RADIATION DETECTING APPARATUS, AND RADIATION DETECTING APPARATUS AND RADIATION IMAGING SYSTEM

(76) Inventors: Takamasa Ishii, Honjo-shi (JP); Chiori Mochizuki, Sagamihara-shi (JP); Minoru Watanabe, Honjo-shi (JP)

( * ) Notice: Subject to any disclaimer, the term of this patent is extended or adjusted under 35 U.S.C. 154(b) by 578 days.

(21) Appl. No.: 12/676,352

(22) PCT Filed: Nov. 4, 2008

(86) PCT No.: PCT/JP2008/070370

§ 371 (c)(1), (2), (4) Date: Mar. 3, 2010

(87) PCT Pub. No.: WO2009/060968

PCT Pub. Date: May 14, 2009

(65) Prior Publication Data

US 2010/0193691 A1 Aug. 5, 2010

(30) Foreign Application Priority Data

Nov. 5, 2007 (JP) ................................ 2007-287402
Oct. 23, 2008 (JP) ................................ 2008-273193

(51) Int. Cl.
*H01L 27/146* (2006.01)

(52) U.S. Cl.
USPC .................................................... 250/370.08

(58) Field of Classification Search ............ 250/370.01–370.15; 378/98.8
See application file for complete search history.

(56) References Cited

U.S. PATENT DOCUMENTS 6,049,074 A 4/2000 Endo et al. ................ 250/208.1
6,127,199 A 10/2000 Inoue et al. ..................... 438/30
6,354,595 B1 3/2002 Vieux et al. .................. 277/312
6,372,608 B1 4/2002 Shimoda et al. ............. 438/455
6,753,915 B1 6/2004 Mochizuki .................... 348/302
6,847,039 B2 1/2005 Mochizuki .............. 250/370.09
6,944,266 B2 9/2005 Yamazaki et al. .......... 378/98.7
6,984,813 B2 1/2006 Ishii et al. ................. 250/208.1
7,126,158 B2 10/2006 Morii et al. ..................... 257/59
7,315,028 B2 1/2008 Mochizuki .............. 250/370.11

(Continued)

FOREIGN PATENT DOCUMENTS

CN 1199507 11/1998
CN 101002110 7/2007

(Continued)

OTHER PUBLICATIONS

Chinese Office Action dated May 25, 2011 in corresponding Chinese Application 200880114009.8, and English translation thereof.

*Primary Examiner* — Kiho Kim

(74) *Attorney, Agent, or Firm* — Fitzpatrick, Cella, Harper & Scinto

(57) ABSTRACT

The object of the invention is to realize a light radiation-detecting apparatus including a step of preparing a matrix array including a substrate, an insulating layer arranged on the substrate, a plurality of pixels arranged on the insulating layer, wherein the pixel includes a conversion element converting an incident radiation into an electric signal, and connection electrode arranged at a periphery of the plurality of pixels, fixing a flexible supporting member for covering the plurality of pixels to the matrix array at a side opposite to the substrate, and releasing the substrate from the matrix array.

28 Claims, 20 Drawing Sheets

U.S. PATENT DOCUMENTS

| | | | | |
|---|---|---|---|---|
| 7,521,684 | B2 | 4/2009 | Nomura et al. | 250/370.09 |
| 7,692,152 | B2 * | 4/2010 | Inoue | 250/361 R |
| 2003/0047280 | A1 | 3/2003 | Takayama et al. | 156/344 |
| 2004/0016886 | A1 | 1/2004 | Ringermacher et al. | 250/370.11 |
| 2007/0114426 | A1 | 5/2007 | Tkaczyk | 250/370.09 |
| 2007/0116179 | A1 * | 5/2007 | Spahn et al. | 378/98.8 |
| 2007/0257198 | A1 | 11/2007 | Ogawa et al. | 250/370.11 |
| 2008/0042070 | A1 * | 2/2008 | Levin | 250/370.13 |
| 2009/0283689 | A1 | 11/2009 | Mochizuki et al. | 250/370.14 |

FOREIGN PATENT DOCUMENTS

| | | |
|---|---|---|
| JP | 2005-201807 | 7/2005 |
| JP | 2007-149749 | 6/2007 |
| KR | 10-2004-0097228 | 11/2004 |
| WO | 98/09333 | 5/1998 |
| WO | 98/32179 | 7/1998 |

* cited by examiner 212
211
114
113
C'
115
103
112
104
105
23
106
26
111
28
27
C 212
114
113
115
211
21

212
123
122
121
221
213
124
125
126
21

MANUFACTURING METHOD OF RADIATION DETECTING APPARATUS, AND RADIATION DETECTING APPARATUS AND RADIATION IMAGING SYSTEM

TECHNICAL FIELD

The present invention relates to a manufacturing method of a radiation detecting apparatus applied to a medical-image diagnosis apparatus, a nondestructive inspection tool, and an analysis apparatus using radiation, and a radiation detecting apparatus and a radiation imaging system.

BACKGROUND OF ART

In recent years, a manufacturing technology of matrix panels for a display apparatus such as a liquid crystal display using a thin film transistor (TFT) has being developed. The panels have become larger, and so have the display parts. The manufacturing technology is applied to the matrix panel served as an area sensor having a large area which includes a conversion element (photoelectric conversion element) formed by a semiconductor and a switch element such as the TFT. The matrix panel is combined with a scintillator layer that converts radiation including X-ray into light including visible light as discussed in Japanese Patent Application Laid-Open No. 2007-149749 for a field of the radiation detecting apparatus such as a medical X-ray detecting apparatus.

On the other hand, a flexible display apparatus has being also developed using a plastic substrate which can be expected to be decreased in weight and increased in reliability for withstanding a shock and deformation compared to a glass substrate.

U.S. Pat. No. 6,372,608 and U.S. Patent Publication No. 2003/0047280 discuss methods of manufacturing a matrix panel served as a flexible display apparatus described above. They are manufactured by forming a thin film element on a glass substrate via a release layer, connecting a transfer member such as the plastic substrate via an adhesive layer on the thin film element, releasing the glass substrate by irradiating light such as laser on the release layer, and transferring the thin film element onto the plastic substrate.

DISCLOSURE OF THE INVENTION

The radiation detecting apparatus is classified into two types, which are a stationary type and a portable type. The apparatuses of both types are desired to be decreased in weight. In particular, for the portable type, since a patient may carry the radiation detecting apparatus or hold the radiation detecting apparatus by oneself for imaging, the apparatus is desired to be further decreased in weight. However, any of the patent references described above can not realize the best structure of the light radiation-detecting apparatus.

Therefore, an object of the present invention is to provide a light radiation-detecting apparatus.

In order to address the problem described above, the manufacturing method of the radiation detecting apparatus according to the present invention includes steps of preparing a matrix array including a substrate, an insulating layer arranged on the substrate, and a plurality of pixels arranged on the insulating layer, wherein the pixel includes a conversion element converting an incident radiation or light into an electric signal, fixing a flexible supporting member for covering the plurality of pixels to the matrix array at a side opposite to the substrate, and releasing the substrate from the matrix array.

According to the present invention, the light radiation-detecting apparatus can be realized.

Other features and advantages of the present invention will be apparent from the following description taken in conjunction with the accompanying drawings, in which like reference characters designate the same or similar parts throughout the figures thereof.

BEST MODES FOR CARRYING OUT THE INVENTION

Figure 1:
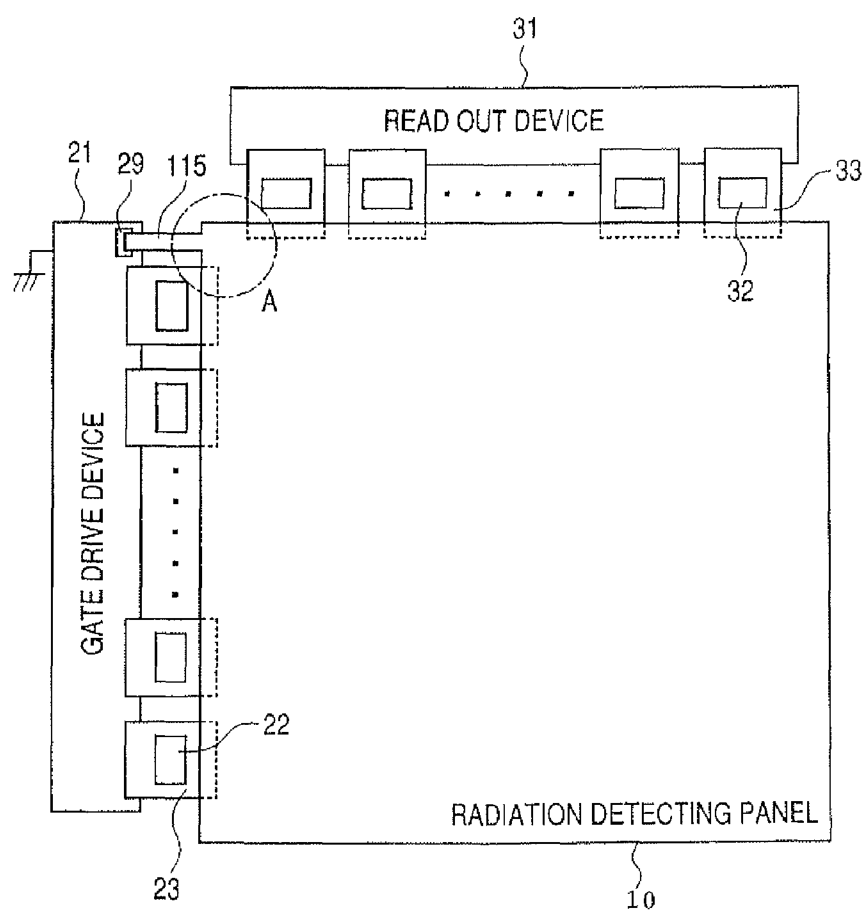
FIG. 1 is a top plan view illustrating a radiation detecting panel of a radiation detecting apparatus which is a first exemplary embodiment of the present invention.

Exemplary embodiments of the present invention will be described in detail below, with reference to the drawings. Note that radiation in the specification of the present invention includes electromagnetic waves of X-ray and γ-ray, and corpuscular ray such as α-ray and β-ray. The conversion element refers to a semiconductor device which converts at least light or radiation into an electric signal.

First Embodiment

With reference to the drawing, a matrix panel (a flexible radiation detecting panel herein) having flexibility in a radiation detecting apparatus which is a first embodiment of the present invention will be described below.

Figure 2:
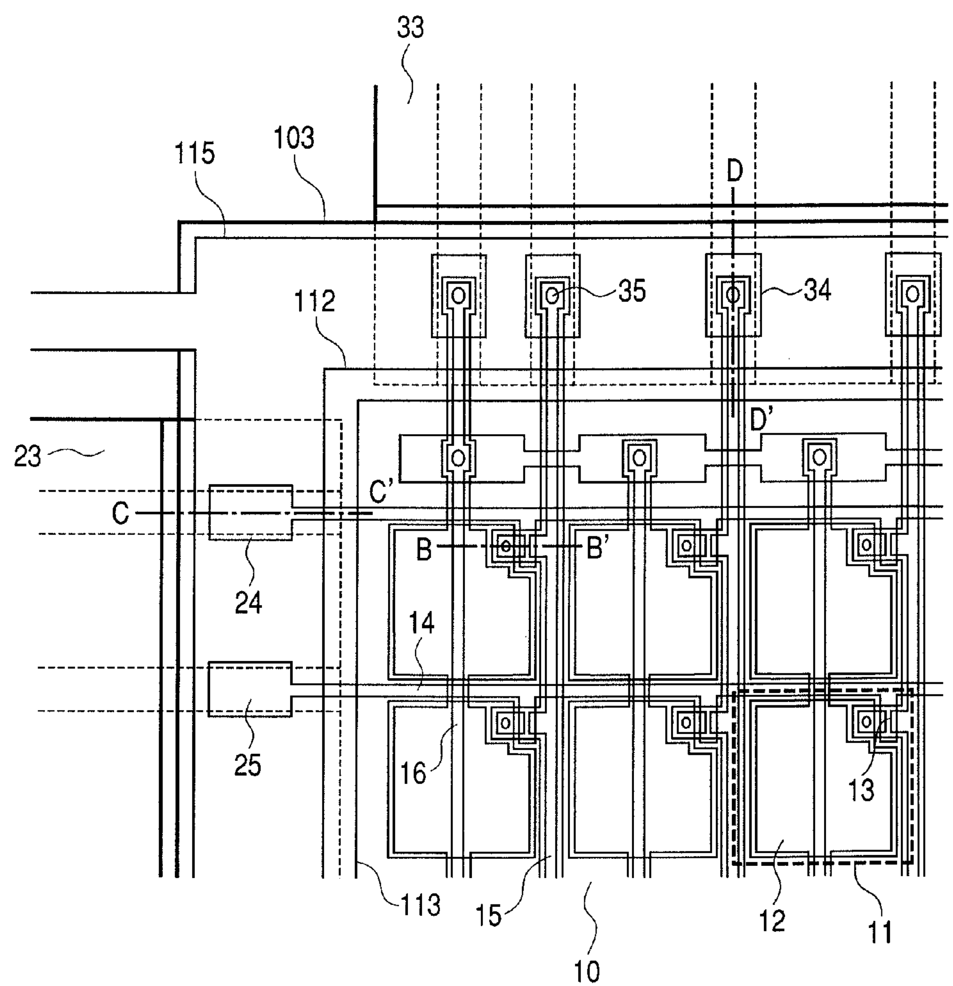
FIG. 2 is an enlarged top plan view of an A portion in FIG. 1.
Figure 6:
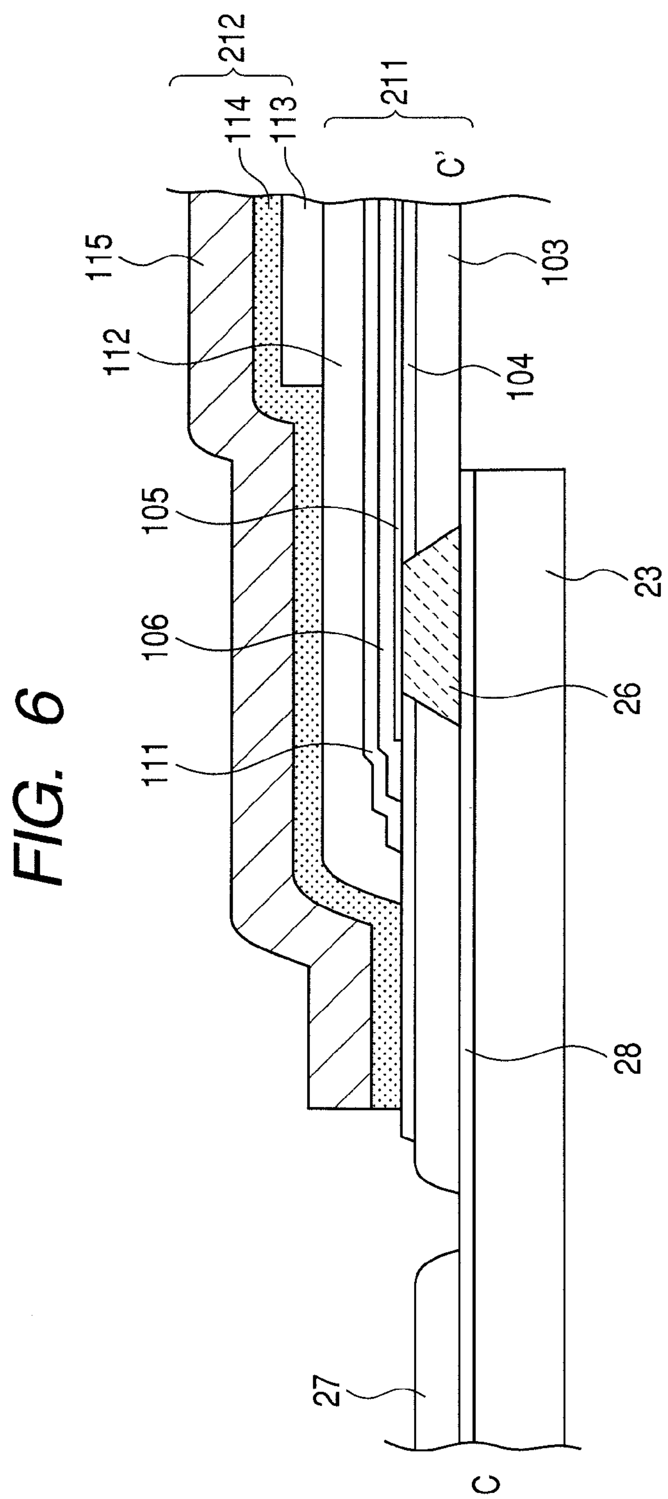
FIG. 6 is a cross sectional view taken along the line C-C' in FIG. 2.
Figure 7:
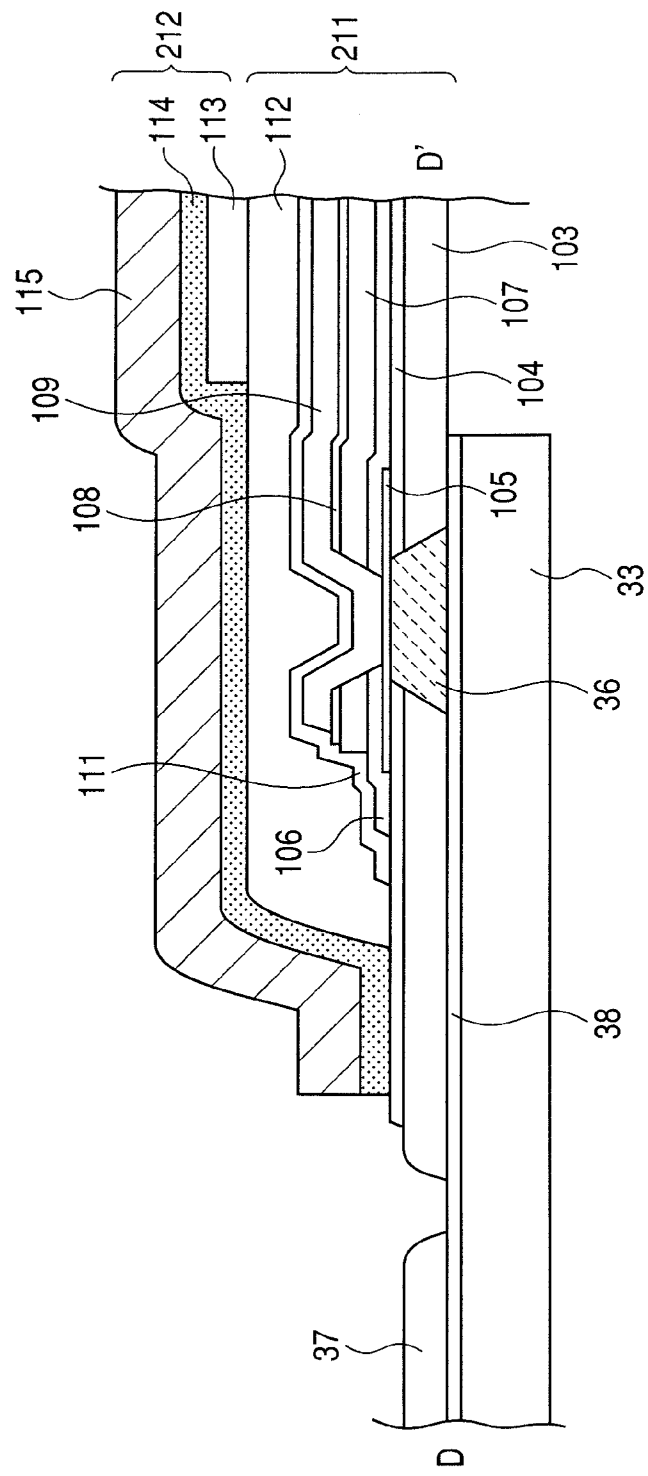
FIG. 7 is a cross sectional view taken along the line D-D' in FIG. 2.
Figure 8A:
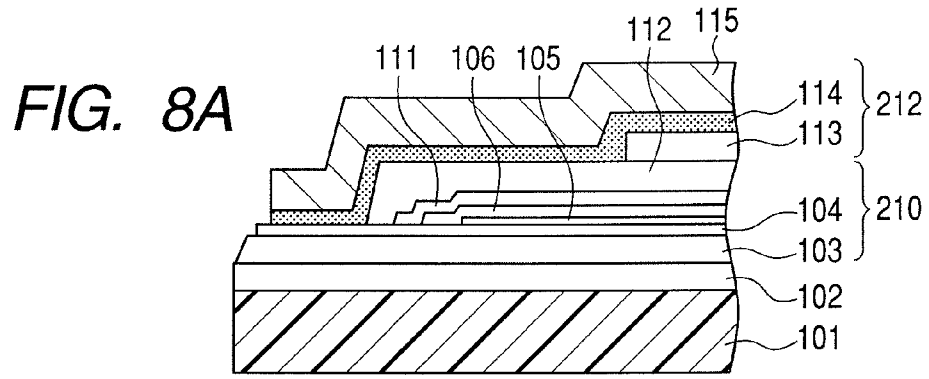
FIGS. 8A, 8B, 8C and 8D are cross sectional views of a part for connecting the radiation detecting panel and an external-circuit connection unit illustrating the manufacturing method of the radiation detecting apparatus of the present invention.
Figure 8B:
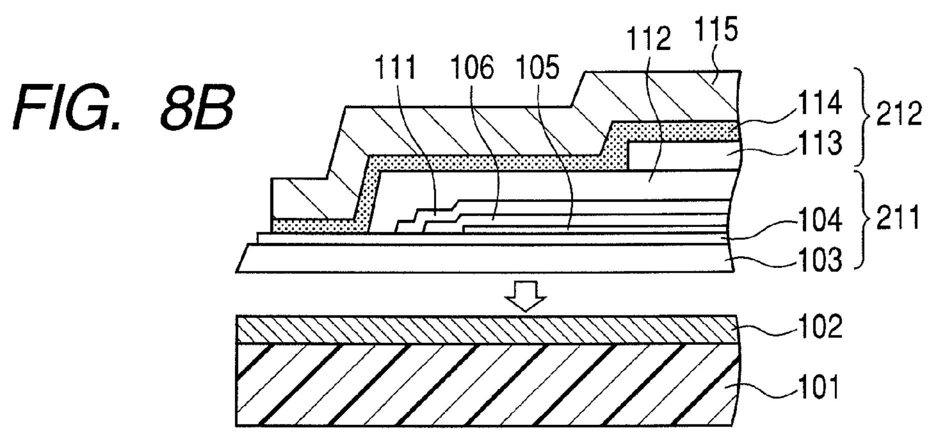
Figure 8C:
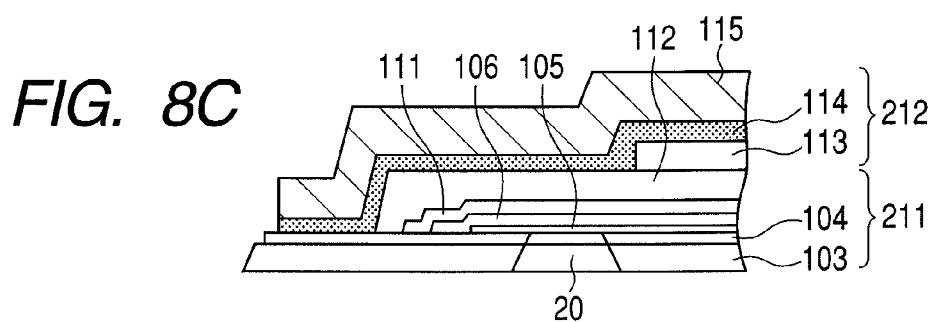
Figure 8D:
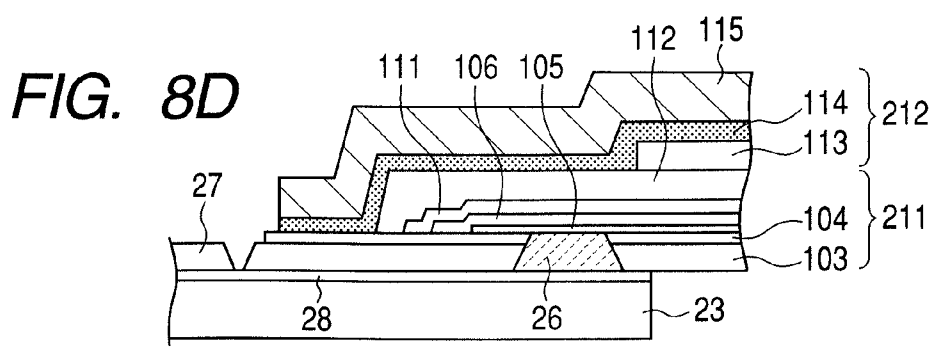
Figure 9:
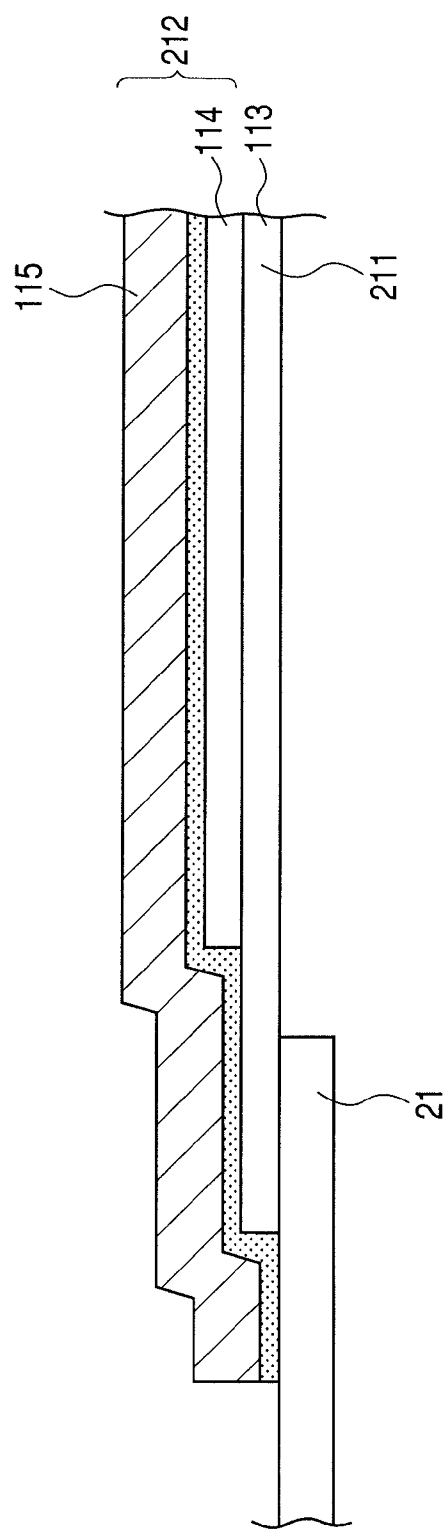
FIG. 9 is a cross sectional view of the part for connecting the radiation detecting panel to the external-circuit connection unit illustrating the radiation detecting apparatus which is a first exemplary embodiment of the present invention.

FIG. 1 is a top plan view of a flexible radiation detecting panel and external circuits. FIG. 2 is an enlarged top plan view of an A portion in FIG. 1. FIGS. 3A to 3D, 4A, 4B, and 5 are diagrams illustrating a manufacturing method using the cross sectional views of one pixel taken along the line B-B' in FIG. 2. FIG. 6 is a cross sectional view taken along the line C-C' in FIG. 2. FIG. 7 is a cross sectional view taken along the line D-D' in FIG. 2. FIGS. 8A to 8D are cross sectional views taken along the line C-C' in FIG. 2 illustrating the manufacturing method. Further, FIG. 9 is a cross sectional view of the part for connecting the flexible radiation detecting panel to the external-circuit.

A flexible radiation detecting panel 10 according to the present exemplary embodiment is connected to the external devices as illustrated in FIG. 1 to configure the radiation detecting apparatus. The flexible radiation detecting panel 10 is electrically connected to a gate driving apparatus 21 via a driving-circuit connection unit 23 including the driving circuit 22 which is one of the external circuits, and further connected to a read-out apparatus 31 via a read-out circuit connection unit 33 including a read-out circuit 32 which is another external circuit. On the flexible radiation detecting panel, at least a plurality of pixels, a plurality of wirings, and connection electrodes which are arranged at periphery of the plurality of pixels and electrically connected to each of the plurality of wirings are arranged. The plurality of pixels includes a converting element and a switch element. The gate driving apparatus controls on and off of a switch element (TFT). The reading out device has a function for reading out a signal from the TFT to the external. An electromagnetic shielding layer 115 of the radiation detecting panel 10 is electrically connected to a ground terminal 29 (GND terminal) of the gate driving apparatus 21.

In FIG. 2, the flexible radiation detecting panel 10 includes a photoelectric conversion element 12 that is a converting element and a TFT 13 in each pixel 11, and a plan view of a first insulating layer 103, the Al layer 115, a fifth insulating layer 112 and a scintillator layer 113 is illustrated. Further, a connecting part 25 where the connection electrode 24 is connected to a driving-circuit connection unit 23 and a connecting part 35 where a connection electrode 34 is connected to a read-out circuit connection unit 33 are illustrated.

Next, fundamental rules of movements are described. A bias is applied to a bias line 16 (Vs line) so that a photoelectric conversion layer in a photoelectric conversion element 12 becomes depleted. For example, a reference electric potential (GND) is applied to a signal line 15 (Sig line), and 10 V is applied to the Vs line 16. In this state, the X-ray sent to an object is transmitted as being attenuated by the object, and converted into visible ray in a scintillator layer (flexible scintillator layer) having flexibility, not illustrated here, and then enter the photoelectric conversion element 12 to be converted into an electric charge. The electric charge is transferred to the Sig line 15 via TFT 13 that is turned on by a gate driving pulse applied to a gate line 14 (Vg line) from a gate driving apparatus 21 and read out to the external by the read-out apparatus 31. Thereafter, a remaining electric charge which has generated in the photoelectric conversion element 12 by a change of an electric potential of the Vs line 16 and has not yet been transferred is removed. At this point, the bias of the Vs line 16 is changed from, for example, 10 V to −5 V. The remaining electric charge may be removed by transfer using the TFT 13.

FIG. 3A to 3D illustrate steps of manufacturing the radiation detecting panel.

The radiation detecting panel is formed by arranging a photoelectric conversion element and the TFT, and further the scintillator layer on the substrate. The steps will be described in detail below.

Figure 3A:
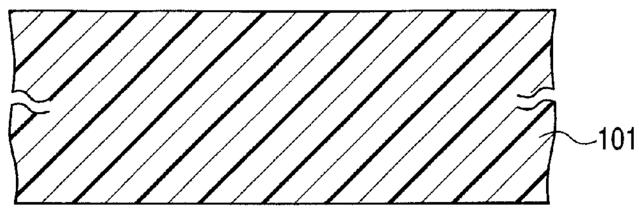
FIGS. 3A, 3B, 3C and 3D are cross sectional views corresponding to one pixel taken along the line B-B' in FIG. 2 for illustrating a manufacturing method of the radiation detecting panel.
Figure 3B:
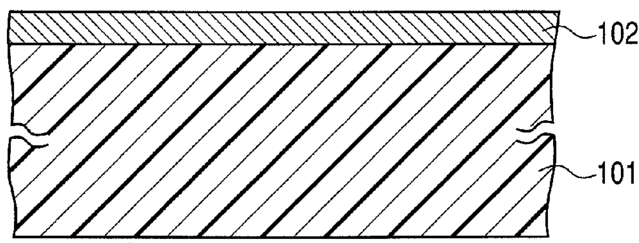
Figure 3C:
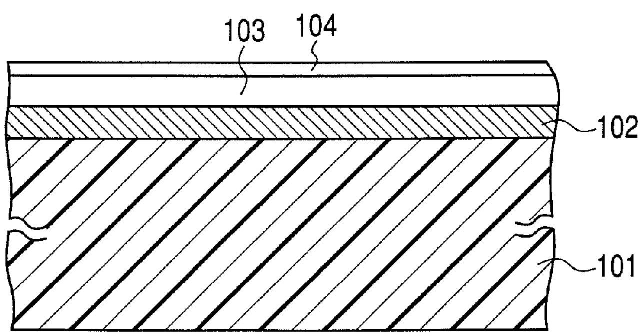
Figure 3D:
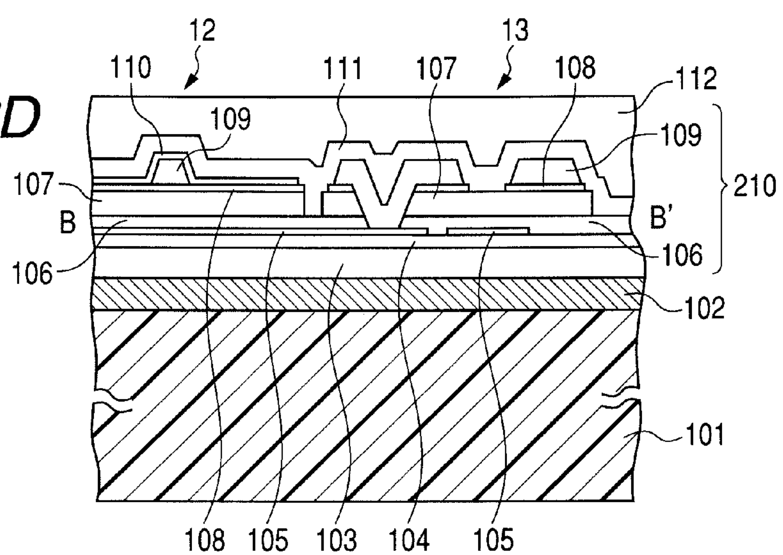

FIG. 3A illustrates a step of preparing a substrate 101. The substrate 101 uses a material which is highly rigid and temperature resistant for forming the converting element and the TFT. In particular, a transparent insulating substrate made of glass or ceramic can be used. FIG. 3B illustrates a step of forming a release layer, and a release layer 102 is formed on the substrate 101. FIG. 3C illustrates a step of forming an insulating layer, and a first insulating layer 103 and a second insulating layer 104 are sequentially formed on the release layer 102. FIG. 3D illustrates a step of forming the photoelectric conversion element and the TFT, firstly, a photoelectric conversion element 12 and a TFT 13 are formed on the second insulating layer 104. On the photoelectric conversion element 12 and the TFT 13, a forth insulating layer 111 and a fifth insulating layer 112 are formed. The steps described above complete the matrix array 210. The photoelectric conversion element 12 and the TFT 13 are formed after the first conductive layer 105, a third insulating layer 106, an intrinsic semiconductor layer 107, an impurity-doped semiconductor layer 108, a second conductive layer 109 and a third conductive layer 110 are sequentially deposited. One electrode of the photoelectric conversion element 12, a gate electrode of the TFT 13, and the Vg line 14 are formed by the first conductive layer. The Vs line 16 for supplying the bias to the photoelectric conversion element 12, a source and a drain electrode of the TFT 13, and Sig line 15 are formed by the second conductive layer 109. An electrode applying the bias supplied to the Vs line 16 to the overall photoelectric conversion element 12 is formed by the third conductive layer 110, the electrode being transparent and made of indium tin oxide (ITO) and the like. The TFT 13 includes the first conductive layer 105 forming the gate electrode formed in common with Vg line 14, the third insulating layer 106, the intrinsic semiconductor layer 107 which is a channel layer, the impurity-doped semiconductor layer 108, and the second conductive layer 109 forming the source and drain electrodes and the Sig line 15. Amorphous silicon (a-Si) is typically used for the intrinsic semiconductor layer 107, impurity-doped semiconductor layer 108, and the photoelectric conversion element 12. And, amorphous silicon, multicrystal silicon, In—Ga—Zn—O (IGZO) which is transparent amorphous oxide semiconductor are used for the TFT 13. In order to protect the photoelectric conversion element or the TFT from moisture, an inorganic insulating film such as silicon nitride (SiN) is used for the fourth insulating layer 111 to protect from moisture. An organic insulating film such as polyimide is used for a fifth insulating layer 112 to provide with shock-resistance and flatness.

Figure 4A:
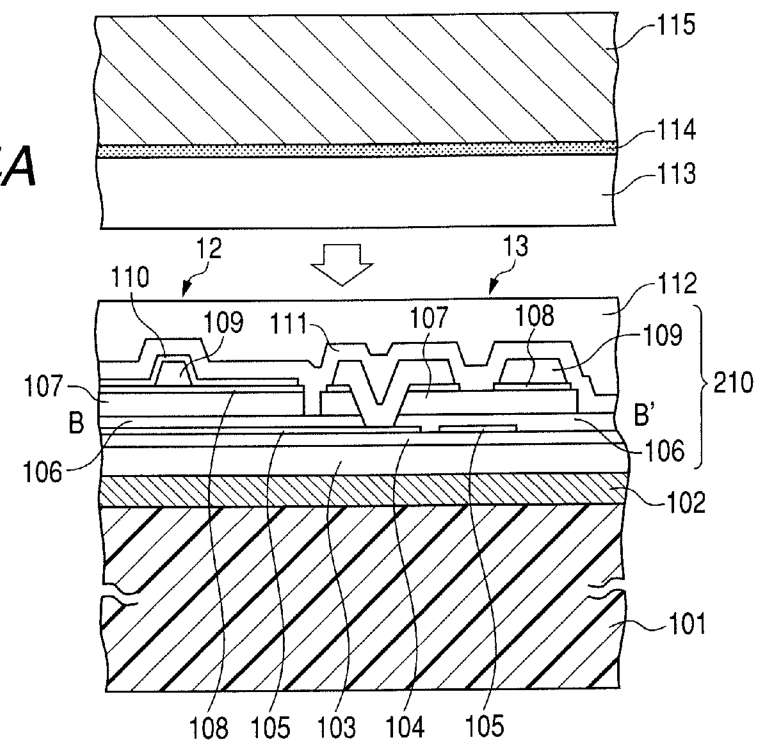
FIGS. 4A and 4B are cross sectional views corresponding to one pixel taken along the line B-B' in FIG. 2 for illustrating a manufacturing method of the radiation detecting panel.
Figure 4B:
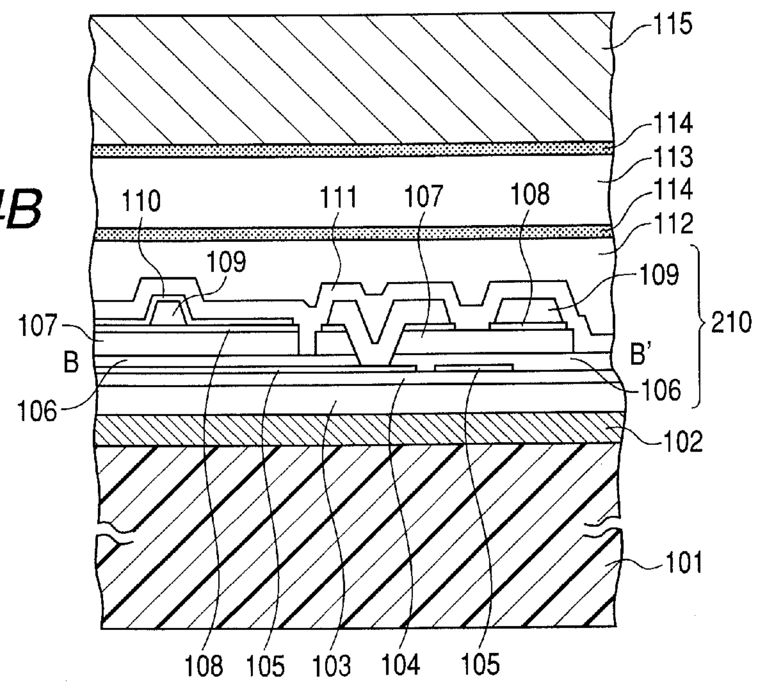
Figure 5A:
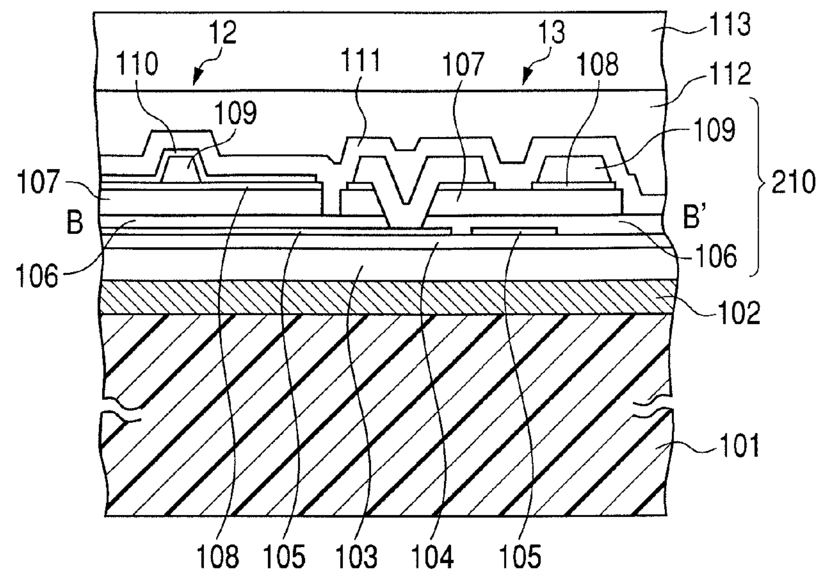
FIGS. 5A and 5B are cross sectional views corresponding to one pixel taken along the line B-B' in FIG. 2 for illustrating a manufacturing method of the radiation detecting panel.
Figure 5B:
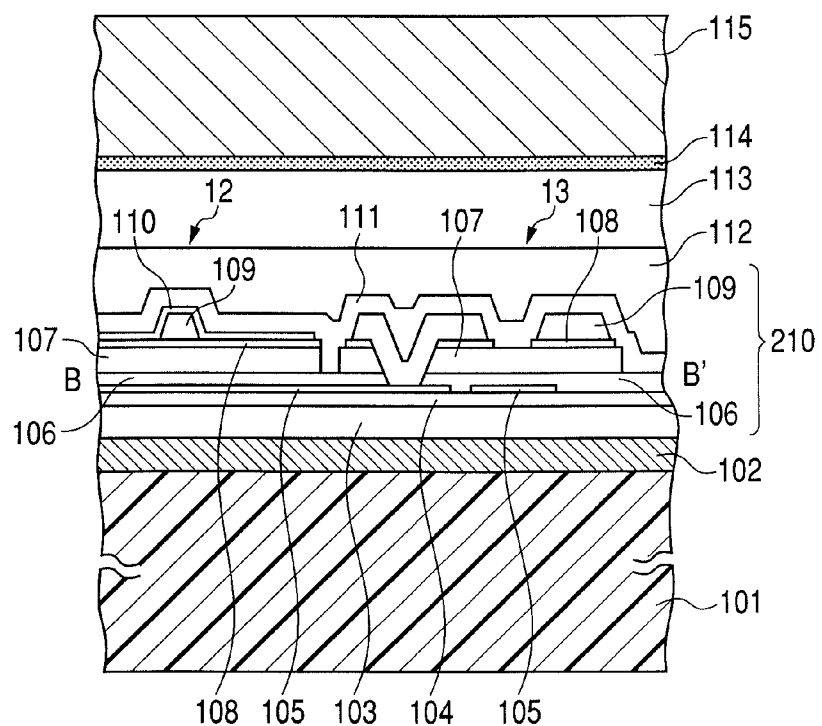

FIGS. 4A to 5B illustrate a step of forming a scintillator layer 113 and the electromagnetic shielding layer 115. FIGS. 4A and 4B illustrate a step of preparing to preliminarily fix the scintillator layer 113 and electromagnetic shielding layer 115 to each other with adhesive agent, and then fixing a side of the scintillator layer with adhesive layer 114 on the fifth insulating layer 112 where the plurality of pixels to be arranged. FIGS. 5A and 5B illustrate a step of forming the scintillator layer 113 on the fifth insulating layer 112 and fixing the electromagnetic shielding layer 115 on the scintillator layer 113 with the adhesive layer 114. The plurality of pixels, the scintillator layer, and an electromagnetic shielding layer are laminated in this order as described above. The electromagnetic shielding layer 115 can be formed of a metal layer made from aluminum provided for the purpose of shielding an electromagnetic wave and preventing from incoming moisture. The electromagnetic shielding layer may be made from other metals than the aluminum and may be formed by deposition of the metal and resin to improve strength. A scintillator member 212 having flexibility includes scintillator layer 113, the adhesive layer 114, and the electromagnetic shielding layer 115. A scintillator material such as cesium iodide (CsI) having a columnar-crystal structure and gadolinium oxysulfides (GOS) including fluorescent particles mixed with binder can be used for the scintillator layer. Since the GOS is more flexible than the CsI, the GOS is more preferable. Now, there is described an example in which each layer of the photoelectric conversion element 12 and the TFT 13 in the matrix array 210 is simultaneously formed so that a manufacturing process can be simplified. A structure from the first insulating layer 103 to the fifth insulating layer 112 in the radiation detecting panel 10 from which the substrate 101 and release layer 102 are released is referred to as a matrix array 211 having flexibility (flexible matrix array). The flexible matrix array 211 includes at least the insulating layer, a plurality of conversion elements on the insulating layer, a plurality of wirings, and the connection electrodes electrically connected to each of the plurality of wirings. The plurality of pixels, the first scintillator layer, and an electromagnetic shielding layer are laminated in this order as described above. The matrix array includes, for example, an addition of the insulating layer at a front surface or/and a back surface.

With reference to FIGS. 6 and 7, structures of connecting part 25 and 35 which connect the radiation detecting panel and an external-circuit connection unit (driving-circuit connection unit 23 or reading-out-circuit connection unit 33) illustrated in FIG. 2 will be described. FIG. 6 is a cross sectional view of the connecting part 25 of the Vg line and the driving-circuit connection unit 23. The Vg line and the connection electrode 24 are formed of a first electrode layer 105. That is, a first Vg line 14 is electrically connected to the connection electrode 24. Further, FIG. 7 is a cross sectional view of the connecting part 35 of the Sig line 15 and the read-out circuit connection unit 33, and the second conductive layer 109 forming the Sig line 15 is connected to the first conductive layer 105 forming the connection electrode 34. As described above, the wirings such as the Vg line 14 and Sig line 15 are electrically connected to the connection electrodes 24 and 34.

As illustrated in FIGS. 6 and 7, after the release layer 102 and the insulating substrate 101 are released, the connection electrode is exposed. Subsequently, the connection electrode 24 electrically connected to each wire and the driving-circuit connection electrode 28 are electrically connected to each other via conductive adhesive agent 26. Likewise, the connection electrode 34 and a read-out circuit connection electrode 38 are electrically connected to each other via conductive adhesive agent 36. That is, the radiation detecting panel and the external-circuit connection unit are electrically connected to each other. A driving circuit 22 and the read-out circuit 32 are respectively protected by a driving-circuit protection layer 27 and a read-out circuit protection layer 37. Further, as illustrated in the figures, adhesive layer 114 and the electromagnetic shielding layer 115 are formed to overlap a part of the external-circuit connection unit at a side opposite to the connecting part where each wire is electrically connected to the external-circuit connection unit. That is, the electromagnetic shielding layer 115 of the scintillator member 212 is a supporting member having flexibility which is arranged in regions corresponding to the plurality of pixels and the connection electrodes and fixed on the flexible matrix array 211.

FIGS. 8A to 8D illustrate a manufacturing method of the radiation detecting apparatus of the present exemplary embodiment. The connecting part which is a part of the radiation detecting panel illustrated in FIGS. 4A and 4B will be particularly described.

First, the photoelectric conversion element 12 and the TFT 13 are formed on the insulating substrate 101 and the release layer 102 to prepare the matrix array 210. And, the scintillator member 212 is fixed on the matrix array 210. That is, the flexible supporting member is fixed such that the plurality of pixels are covered therewith at a side opposite to a substrate side of the matrix array. FIG. 8A is the radiation detecting panel formed by the steps described above.

Next, the release layer 102 is irradiated with the laser so that the insulating substrate 101 and the release layer 102 are released from the radiation detecting panel. FIG. 8B illustrates the flexible radiation detecting panel, the substrate 101, and the release layer 102 that are separated by a releasing step.

Next, etching is performed to expose the first conductive layer 105. FIG. 8C illustrates the flexible radiation detecting panel formed with an opening 20 in the first insulating layer 103 and the second insulating layer 104 thereof by the etching step.

Next, the conductive adhesive agent 26 is applied on the opening 20 to electrically, mechanically connect the flexible radiation detecting panel to the driving-circuit connection unit. FIG. 8D illustrates the radiation detecting apparatus having flexibility formed by a connecting step.

Further, the radiation detecting apparatus having flexibility is stored in a case body together with an image-processing circuit, a battery, and a communication unit.

FIG. 9 is a cross sectional view illustrating an apparatus in which the gate driving apparatus 21 is connected to the matrix array 211 and the electromagnetic shielding layer 115 is arranged beyond a peripheral portion of the matrix array 211. A structure in which the flexible supporting member holds the flexible matrix array and the external-circuit connection unit improves reliability of the radiation detecting apparatus having flexibility.

Figure 10A:
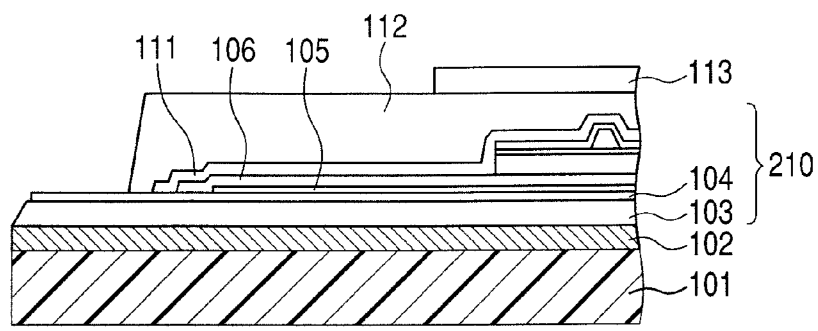
FIGS. 10A, 10B and 10C are cross sectional views of the part for connecting the radiation detecting panel to the external-circuit connection unit illustrating the radiation detecting apparatus and the method thereof that are the other example of the first exemplary embodiment of the present invention.
Figure 10B:
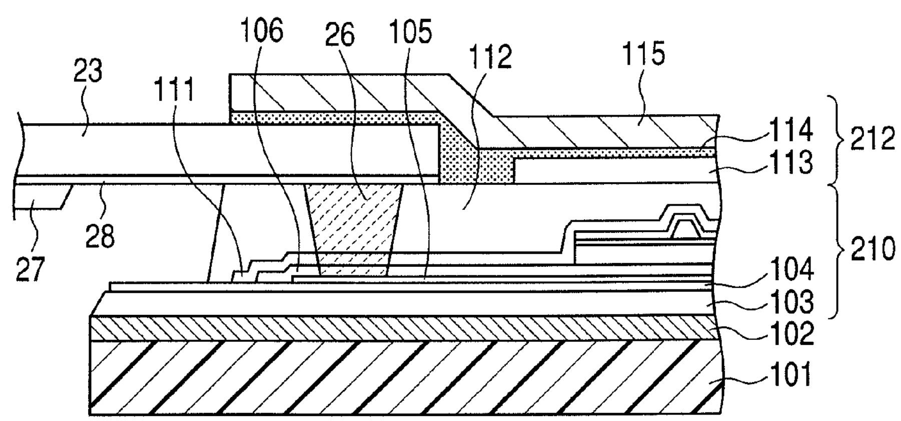
Figure 10C:
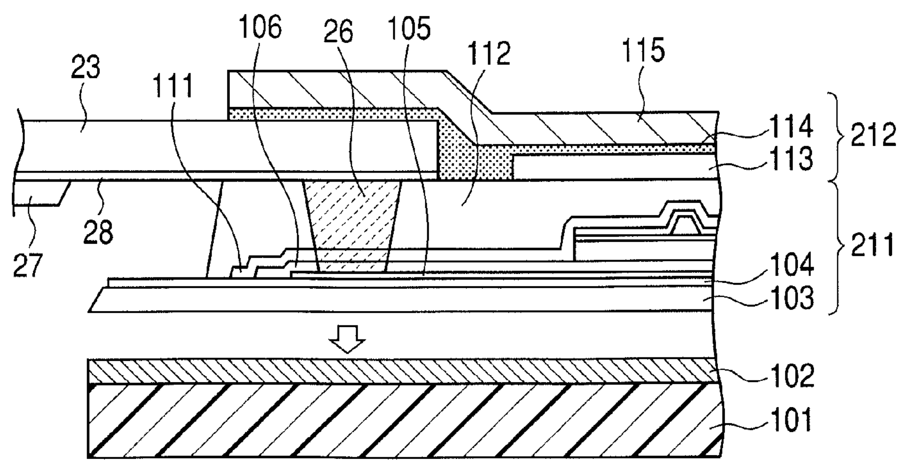
Figure 11:
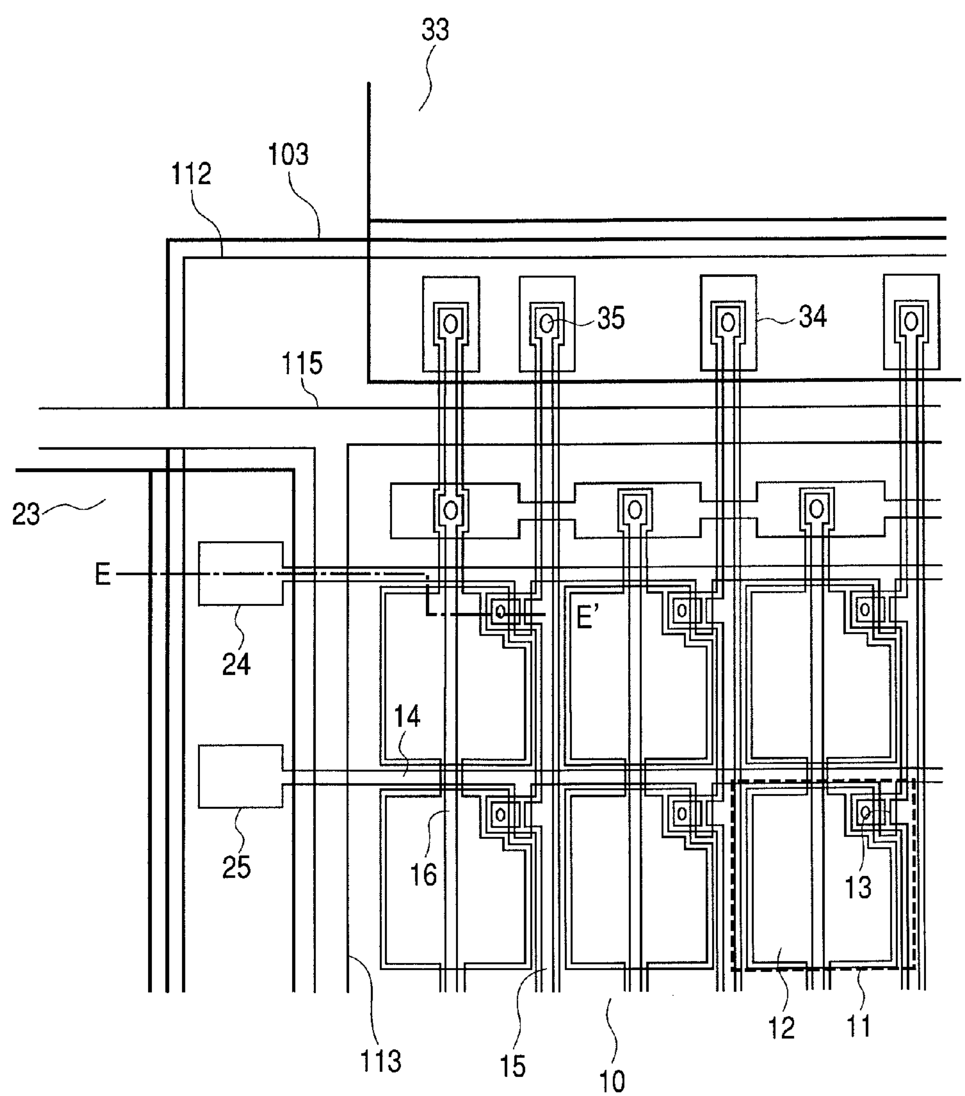
FIG. 11 is a top plan view of the radiation detecting panel of the radiation detecting apparatus which is the other example of the first exemplary embodiment of the present invention.

FIGS. 10A to 10C, unlike the structures illustrated in FIGS. 8A to 9, illustrate a structure in which the driving-circuit connection unit is sandwiched between the flexible matrix array 211 and scintillator member 212. FIG. 10A illustrates a structure in which the scintillator layer 113 is formed on the fifth insulating layer 112 by the step of forming the scintillator layer. FIG. 10B illustrates a step of forming connection of the driving-circuit connection unit and the electromagnetic shielding layer. The opening is formed in the third insulating layer 106, the fourth insulating layer 111, and the fifth insulating layer 112 at a side opposite to the substrate 101 so that the connection electrode is electrically connected to the driving-circuit connection unit with the conductive adhesive agent 26. The driving-circuit connection unit is sandwiched at both sides thereof between the electromagnetic shielding layer and the matrix array 210. FIG. 10C illustrates a state in which the substrate 101 and the release layer 102 are released by the releasing step to form the flexible radiation detecting panel. FIG. 11 is an enlarged top plan view of an A portion in FIG. 1 of the flexible radiation detecting panel and illustrates an arrangement of the electromagnetic shielding layer different from that of FIG. 2. The electromagnetic shielding layer 115 is arranged corresponding to an inside region of the connection electrode 34 and covers a region where the plurality of pixels 11 are arranged.

Figure 12A:
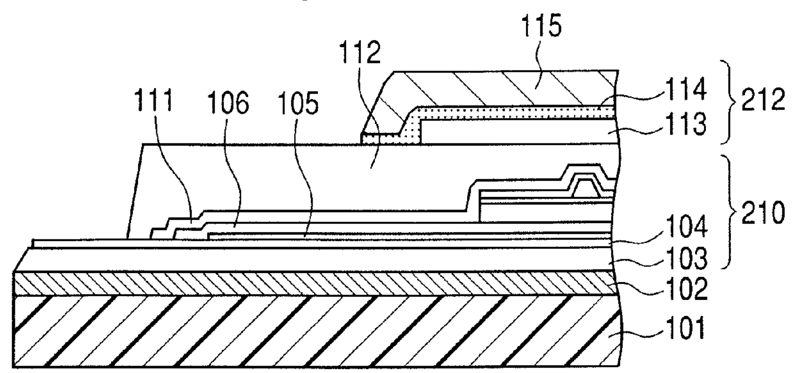
FIGS. 12A, 12B and 12C are cross sectional views of the part for connecting the radiation detecting panel to the external-circuit connection unit taken along the line E-E' in FIG. 11 illustrating the radiation detecting apparatus and the manufacturing method thereof that are the other example of the first exemplary embodiment of the present invention.
Figure 12B:
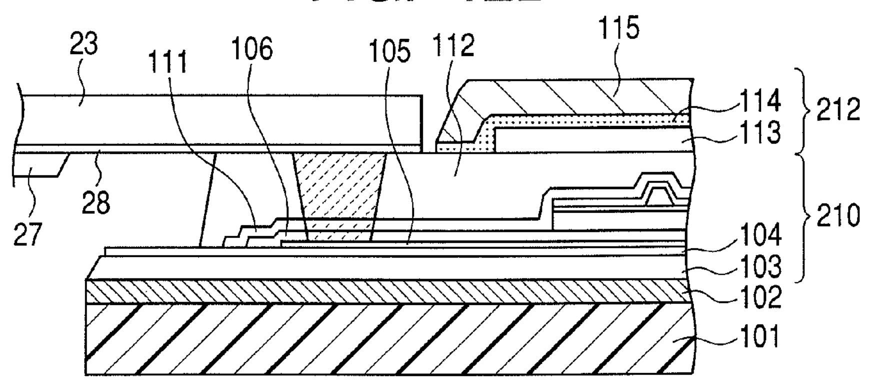
Figure 12C:
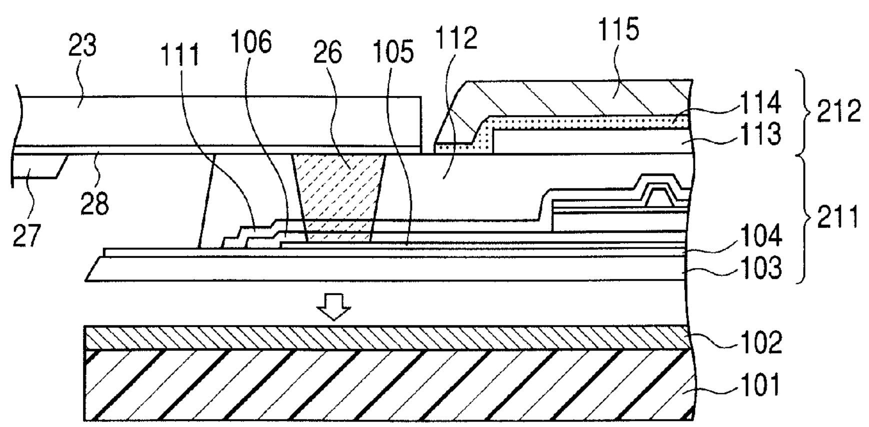

FIGS. 12A to 12B are cross sectional view taken along the line E-E' in FIG. 11. FIG. 12A illustrates the radiation detecting panel formed by a step of fixing the scintillator member 212 on the matrix array 210. FIG. 12B illustrates a state in which an opening is formed on the connection electrode 24 by a step of connecting the driving-circuit connection unit so that the connection electrode is electrically connected to the driving-circuit connection unit with the conductive adhesive agent 26. FIG. 12C illustrates a state in which the substrate 101 and the release layer 102 are released by a releasing step to complete the flexible radiation detecting panel.

As described above, the flexible matrix array is arranged between the external-circuit connection unit and the electromagnetic shielding layer having great strength, flexibility, and a function for shielding an electromagnetic wave. Thus, the flexible radiation detecting apparatus having shock, deformation, and noise resistance, a decreased weight, and an increased reliability can be realized.

Moreover, if the electromagnetic shielding layer 115 is connected to the external-circuit connection unit 14 via the adhesive layer 114, strength of the connecting part can be further improved.

Furthermore, as illustrated in FIGS. 1 and 2, if the electromagnetic shielding layer 115 is connected to the GND terminal which is a ground electrode of the gate driving apparatus, the electromagnetic shielding layer 115 has even further improved effects as the electromagnetic shielding. In a case where the electromagnetic shielding layer 115 is connected to the GND terminal of the reading-out apparatus, similar effects can be generated.

According to the present exemplary embodiment, an example in which strength of the connecting part is improved using the electromagnetic shielding layer 115 as a flexible supporting member is described. All of the scintillator layer 113, adhesive layer 114, and the electromagnetic shielding layer 115 included in the scintillator member are the flexible supporting members, each of which is a functional layer (flexible functional layer) having a unique function. Therefore, if the layers have great strength flexibility, any of the layers can generate similar effects. According to the present exemplary embodiment, the flexible functional layer which is the flexible supporting member is fixed on the side of the flexible matrix array opposite to that of the first insulating layer 103.

Note that FIG. 2 illustrates 3×2 pixels, however, actually, for example, 2000×2000 pixels are arranged to form the flexible radiation detecting panel 10. Further, a photoelectric conversion element different from an MIS-type photoelectric conversion element, for example, a PIN-type photoelectric conversion element, may be used for the conversion element of an indirect-type radiation detecting panel. A pixel structure of the indirect-type radiation detecting panel may be of a flat type in which the photoelectric conversion element and the switch element are formed in a same layer, or a stacked-layer type in which the photoelectric conversion element is formed above the switch element.

Figure 13:
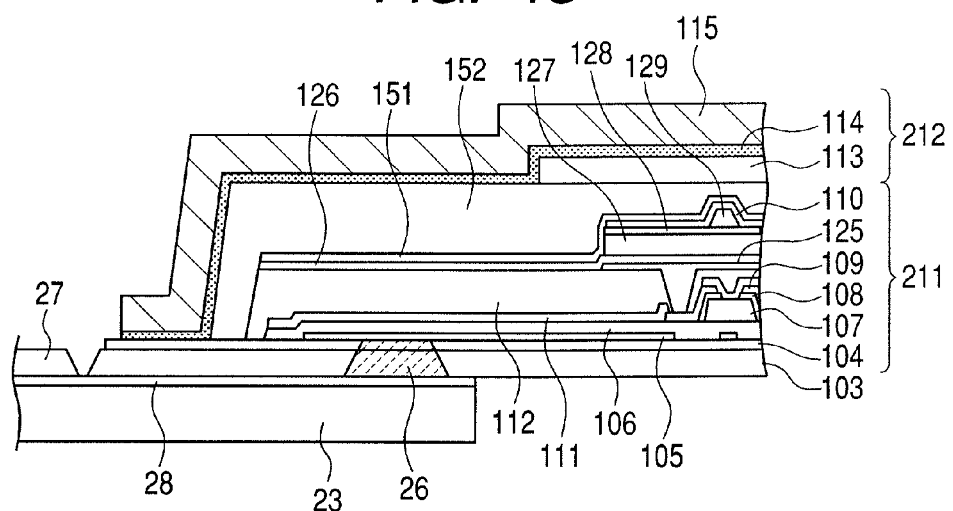
FIG. 13 is a cross sectional view of a part for connecting the radiation detecting panel of a stacked-layer type radiation detecting panel to the external-circuit connection unit.

FIG. 13 illustrates the radiation detecting panel of the stack-layer structure. Components similar to those of FIG. 6 are denoted by similar reference numerals, and description thereof will be omitted. FIG. 13 is different from FIG. 6 in that FIG. 13 includes the MIS-type photoelectric conversion element having a conductive layer 125 which is to be a lower electrode, an insulating layer 126, the intrinsic semiconductor layer 127, the impurity-doped semiconductor layer 128, a conductive layer 129, and the conductive layer 110 which is to be a transparent electrode on the switch element via the insulating layer 111 and the insulating layer 112. FIG. 13 further includes the insulating layer 151 having the inorganic insulating material such as SiN and the insulating layer 152 including the organic insulating material such as polyimide on the MIS-type photoelectric conversion element. Furthermore, according to the present exemplary embodiment, the scintillator layer 113 such as CsI is directly laminated on the fifth insulating layer 112 or the insulating layer 152. As another example, there may be used a radiation detecting panel made of a scintillator member including a carbon board or a laminated film of resin, metal, or resin and metal provided with the scintillator layer such as CsI adhered to the flexible matrix array with the adhesive layer. In this case, the scintillator member having flexibility covers the connection electrode of the flexible matrix array and is fixed to improve the strength. The scintillator member adhered to the flexible matrix array 211 with the adhesive layer is also referred to as a scintillator panel. The adhesive layer 114 made of plastic can be resin having flexibility, and an adhesive agent included in a group of acrylic, urethane, epoxy, olefin and silicon can be used. Further, heat plasticity resin which is hot-melt resin can be used, since heat plasticity resin can be adhered in a short time without solvent. For example, the hot-melt resin such as polyolefin resin, polyester, polyurethane, and epoxy can be used. The hot-melt resin without solvent can be used when the scintillator layer having deliquescence of CsI is adhered to other members.

Figure 14:
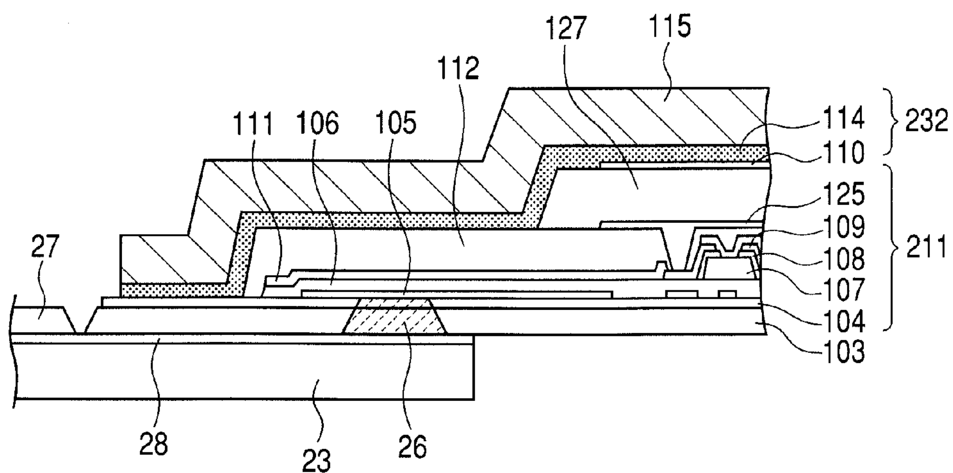
FIG. 14 is a cross sectional view of a part for connecting the radiation detecting panel of a direct-type radiation detecting panel to the external-circuit connection unit.

According to the present exemplary embodiment, the indirect-type radiation detecting panel in which the photoelectric conversion element and the scintillator layer are combined is described, however, the direct-type radiation detecting panel can also generates similar effects. That is, as illustrated in FIG. 14, instead of the photoelectric conversion element, there is used the conversion element in which a semiconductor layer 127 such as amorphous selenium directly converting X-ray, γ-ray, or corpuscular ray such as α ray and β ray into an electric signal (electric charge) is sandwiched between the electrodes in the conductive layer 125 and the conductive layer 110. The present exemplary embodiment can be applied to the direct-type radiation detecting panel using the conversion element described above. In a case where the direct-type radiation detecting panel is used, the insulating layer 115 for covering and protecting the conversion element to which a high voltage is applied can be used as the flexible supporting member 232.

The second and third exemplary embodiments of the present invention will be described below. These embodiments further include a flexible supporting member at a side opposite to the flexible supporting member fixed on the flexible matrix array described in the first exemplary embodiment. That is, the flexible supporting members are fixed on both surfaces of the flexible matrix array so that the flexible supporting member is also arranged at the side of the insulating layer from which the insulating substrate and the release layer are released.

Second Embodiment

First, the radiation detecting apparatus according to the second exemplary embodiment of the present invention will be described, with reference to the drawings. The top plan view of the radiation detecting apparatus of the present exemplary embodiment and the fundamental rules of movements thereof are similar to those of the first exemplary embodiment, and the descriptions thereof will be omitted.

Figure 15:
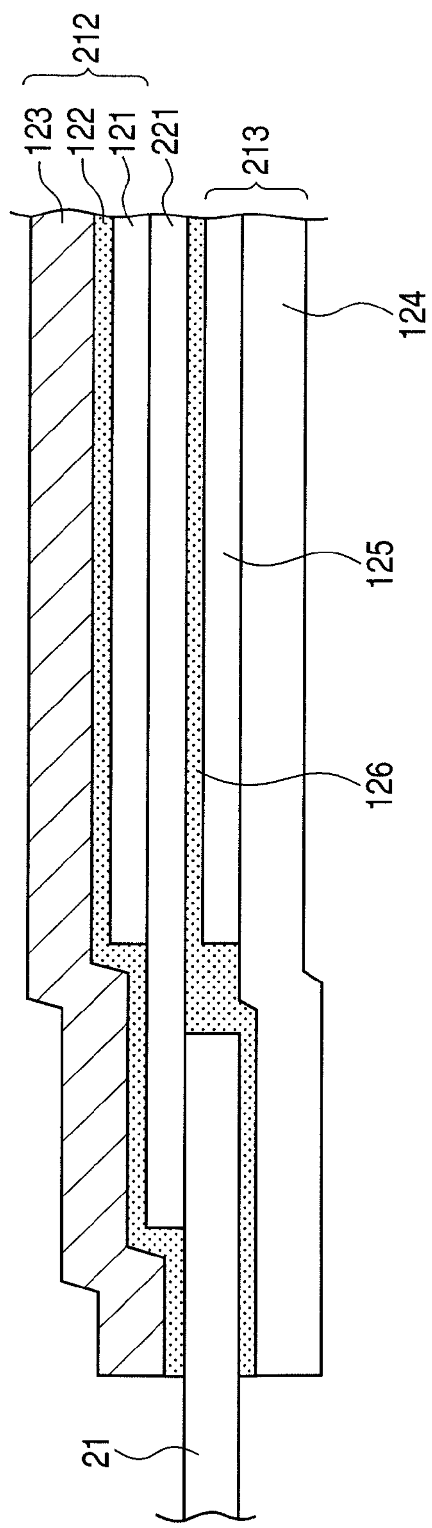
FIG. 15 is a cross sectional view of the part for connecting the radiation detecting panel to the external-circuit connection unit illustrating the radiation detecting apparatus which is a second exemplary embodiment of the present invention.
Figure 16:
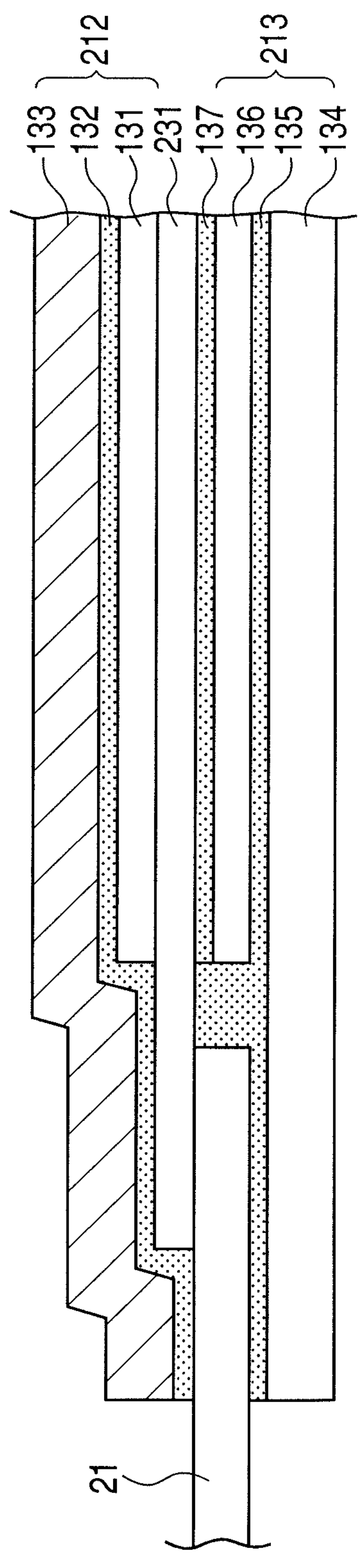
FIG. 16 is a cross sectional view of the part for connecting the radiation detecting panel to the external-circuit connection unit illustrating the radiation detecting apparatus which is a second exemplary embodiment of the present invention.

FIGS. 15 and 16 are cross sectional views of the part for connecting the flexible radiation detecting panel to the external-circuit connection unit included in the radiation detecting apparatus.

In FIG. 15, similarly to the first exemplary embodiment, the flexible radiation detecting panel according to the present exemplary embodiment includes the flexible matrix array formed of the fourth insulating layer 111 and the fifth insulating layer 112 that are sequentially arranged on the photoelectric conversion element 12 and the TFT 13. The scintillator member 212 is fixed on the flexible matrix array. The first scintillator member 212 includes a first scintillator layer 121, an adhesive layer 122, and an electromagnetic shielding layer 123. More specifically, CsI which is the first scintillator layer 121 wavelength converting the X-ray into visible ray is directly evaporated onto the flexible matrix array. Further on the CsI, the adhesive layer 122 and the electromagnetic shielding layer 123 including aluminum (Al) arranged for the purpose of shielding an electromagnetic wave and preventing from incoming moisture are arranged. Note that a side of the first scintillator layer of the first scintillator layer and the first electromagnetic shielding layer that are preliminarily fixed may be fixed on the plurality of pixels of the matrix array with the adhesive agent. The release layer 102 and the insulating substrate 101 are released, and the exposed connection electrode and the gate driving apparatus 21 are connected to each other via the conductive adhesive agent. At this point, the electromagnetic shielding layer 123 is arranged to overlap a part of the gate driving apparatus 21. As illustrated in the figure, the second scintillator member 213 including the second scintillator layer 125 is also arranged at a side to which the gate driving apparatus 21 is connected and which is opposite to a side of the first scintillator member including the first scintillator layer 121 of the flexible matrix array 221. The second scintillator member 213 includes the second scintillator layer and the scintillator-layer supporting plate 124 supporting the second scintillator layer. The second scintillator member 213 is fixed on the flexible matrix array 221 with the adhesive layer 126. With this arrangement, the X-ray which has not been converted into the visible ray in the first scintillator layer 121 arranged at the side in which the X-ray is incident is converted into the visible ray in the second scintillator layer 125 arranged at the side opposite to the first scintillator layer 121 of the flexible matrix array 221.

That is, since the radiation detecting apparatus of the present exemplary embodiment has a structure in which the MIS-type photoelectric conversion element is sandwiched between two scintillator layers, the radiation detecting apparatus can be highly sensitive compared to conventional radiation detecting apparatuses. According to the conventional radiation detecting apparatuses, since a glass substrate that is an insulating substrate exists, the glass substrate and the second scintillator layer need to be adhered to each other. A thickness of the glass substrate is at least 200 μm. Accordingly, even if the second scintillator layer is arranged, the visible ray converted in the second scintillator layer is dispersed in the glass to cause a problem in which resolution is deteriorated while sensitiveness may be improved. That is, improving the sensitivity by the method described above can be realized by removing the glass of the radiation detecting panel. Further, when the pixels are arranged on a plastic substrate instead of the glass substrate and the first and second scintillator layers are arranged thereon, similarly, the resolution is low, since the plastic substrate is thick. In order to obtain the high resolution in a structure where the second scintillator is arranged, a distance between the photoelectric conversion element and the second scintillator layer is 50 μm or less, more preferably 30 μm or less, and most preferably 10 μm or less. A distance between the photoelectric conversion element and the second scintillator layer can be 100 nm or more. That is because, when the inorganic insulating layer including the SiN film and the like arranged between the photoelectric conversion element and the second scintillator layer has a thickness of film 100 nm or more, impacts by moisture on the photoelectric conversion element and the TFT can be decreased.

The incident X-ray into the scintillator layer is absorbed into the scintillator layer from an entering side of the X-ray. A thick scintillator layer can absorb the ray generated at the entering side of the X-ray easier than a thin scintillator layer. Accordingly, in the case where two scintillator layers are arranged as described above, in order to generate a same amount of ray, a total thickness of the two scintillator layers can be smaller than a thickness of the scintillator layer arranged only at one side of the matrix array. Thus, since the first scintillator layer 121 directly deposited can be thinner than that of the first exemplary embodiment, time for forming the first scintillator layer 121 and a tact time can be decreased.

Further, according to the present exemplary embodiment, since the part for connecting the radiation detecting panel to the gate driving apparatus 21 is formed to be sandwiched between the component element of the first scintillator member 212 and that of the second scintillator member 213, strength of the connecting part can be improved compared to the first exemplary embodiment. And, the read-out apparatus may have a structure similar to the gate driving apparatus.

Further, as illustrated in FIG. 16, the matrix array can be formed by being sandwiched between two electromagnetic shielding layers. Similarly to FIG. 15, a second scintillator layer 136 is arranged at the side opposite to the first scintillator layer 131 of a matrix array 231. The flexible matrix array 231 can be formed by being sandwiched between the first electromagnetic shielding layer 133 and a second electromagnetic shielding layer 134. The first electromagnetic shielding layer 133 is adhered by an adhesive layer 132, the second scintillator layer 136 is adhered by an adhesive layer 137, and the second electromagnetic shielding layer 134 is adhered by an adhesive layer 135. This arrangement can further decrease the noise.

As described above, the flexible radiation detecting apparatus having shock, deformation, and noise resistance, a decreased weight, and an increased reliability as well as high sensitivity can be realized.

Third Embodiment

The radiation detecting apparatus which is the third exemplary embodiment of the present invention will be described below, with reference to the drawings. The top plan view of the radiation detecting apparatus of the present exemplary embodiment and the fundamental rules of movements are similar to those of the first exemplary embodiment, and the descriptions thereof will be omitted.

Figure 17:
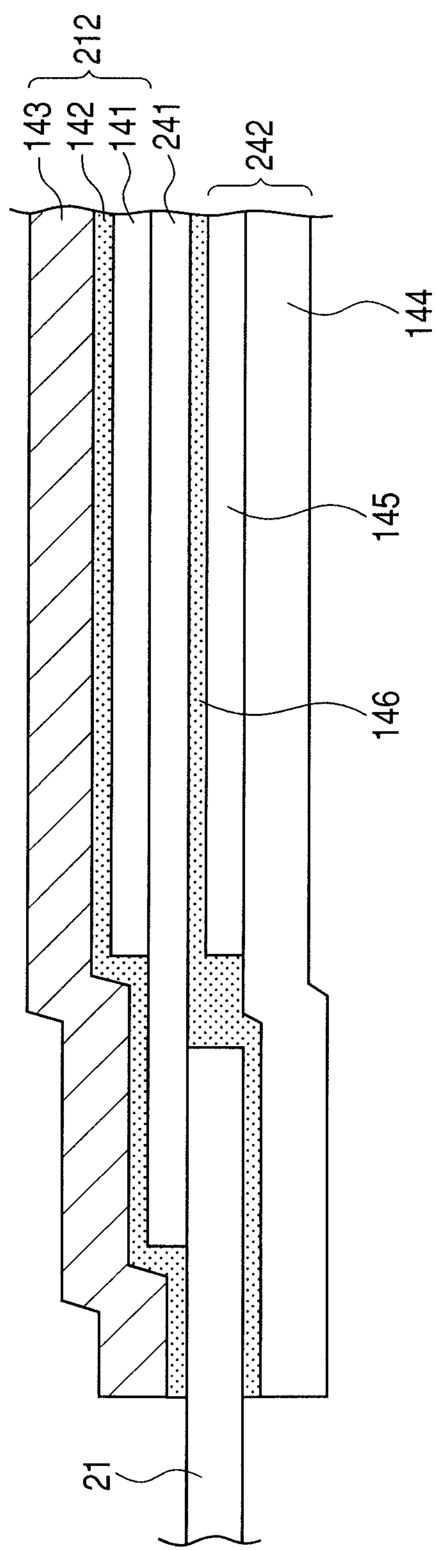
FIG. 17 is a cross sectional view of the part for connecting the radiation detecting panel to the external-circuit connection unit illustrating the radiation detecting apparatus which is a third exemplary embodiment of the present invention.

FIG. 17 illustrates the part for connecting the flexible radiation detecting panel to the gate driving apparatus included in the radiation detecting apparatus.

When imaging is continuously performed using the radiation detecting apparatus like imaging a moving image, even though the X-ray with the same strength enters the radiation detecting panel, an output may be slightly decreased. That is, sensitivity may be changed. To address this problem, a method is known that the imaging is performed after the photoelectric conversion element has been irradiated with the strong ray.

According to the conventional radiation detecting apparatus, a light source having a light-emitting layer such as electroluminescence (EL) or a light-emitting diode (LED) is adhered on the side facing the scintillator layer, that is, on the glass substrate which is the insulating substrate. Therefore, a thickness and a weight of the radiation detecting apparatus are increased.

According to the present exemplary embodiment, after the glass substrate is released from the radiation detecting panel, the light source (flexible light source) as a functional layer which is a flexible supporting member and emits light is arranged at the side opposite to the scintillator layer of the flexible matrix array. In FIG. 17, similarly to FIG. 9, an adhesive layer 142 and an electromagnetic shielding layer 143 are formed on a scintillator layer 141. Compared to FIG. 9, further, a light source 242 including a light emitting layer 145 and a light-emitting-layer supporting plate 144 are fixed on a flexible matrix array 241 by an adhesive layer 146.

This arrangement can realize to decrease the radiation detecting apparatus in weight. Further, as illustrated in the figure, since the part for connecting the flexible radiation detecting panel to the gate driving apparatus is formed by being sandwiched between the electromagnetic shielding layer and the light source, the strength of the connecting part can be improved compared to the first exemplary embodiment. And, the read-out apparatus may have a structure similar to the gate driving apparatus.

As described above, the flexible radiation detecting apparatus having shock, deformation, and noise resistance, a decreased weight, and an increased reliability can be realized.

Fourth Embodiment

According to the present application example, since the insulating substrate such as glass is not used for the radiation detecting panel, the light, compact radiation detecting apparatus of a further thinner, handy type can be realized. A patient who is an object holds the radiation detecting apparatus under his/her arm and a side of the patient is irradiated with the X-ray. Since the radiation detecting apparatus is thin, the apparatus can be easily held under a patient's arm, and further since the apparatus is light, the apparatus can be easily hold fixedly while the imaging is performed. Since a side of the radiation detecting apparatus held by a patient's arm is not connected to a peripheral circuit as illustrated in FIG. 1, the pixels can be arranged up to an end portion of the radiation detecting panel. Thus, the imaging can be performed up to the end portion of the apparatus.

Fifth Embodiment

Figure 18:
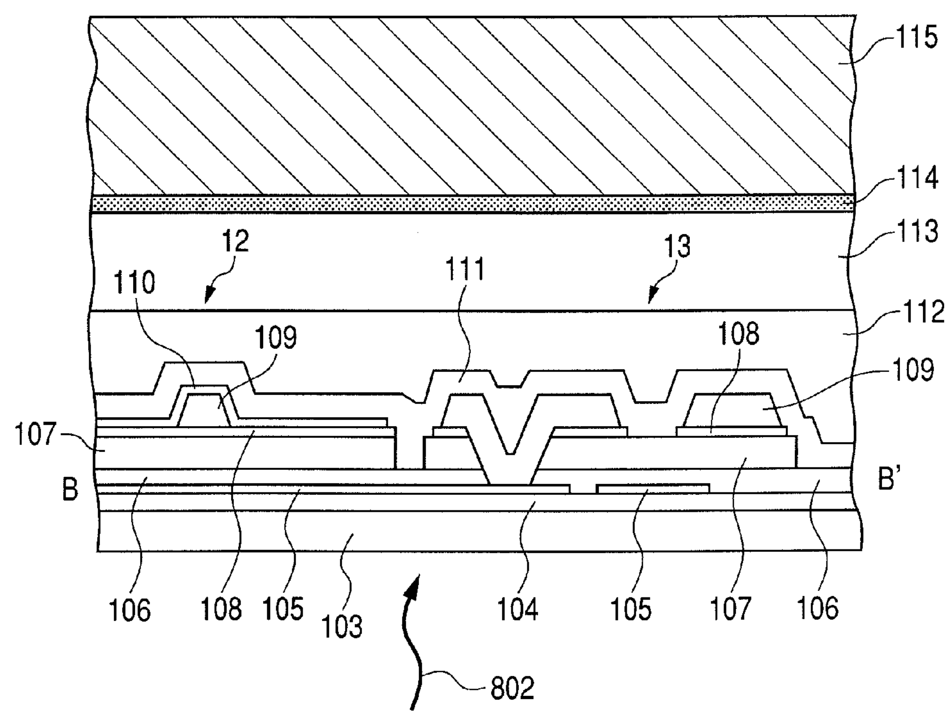
FIG. 18 is a cross sectional view of one pixel illustrating an incident direction of X-ray into the radiation detecting apparatus which is the second application example of the present invention.

FIG. 18 is a cross sectional view of one pixel illustrating an incident direction of the X-ray into the radiation detecting apparatus according to the present invention.

Here, an example in which the radiation detecting panel is used according to the first exemplary embodiment will be described. As illustrated in FIG. 18, since a metal layer which is to be the electromagnetic shielding layer is arranged above the pixel, when the X-ray is entered from above the pixel, the X-ray is attenuated by the metal layer. Therefore, an amount of the X-ray entered into the scintillator layer is decreased more than that of the X-ray transmitted through the patient. On the other hand, when the X-ray 802 is entered from below the pixel, since no thick substrate such as the glass exists below the pixel, the X-ray is not attenuated much. Therefore, the radiation detecting panel can be disposed in the radiation detecting apparatus so that the X-ray enters from below the pixel.

Sixth Embodiment

Figure 19:
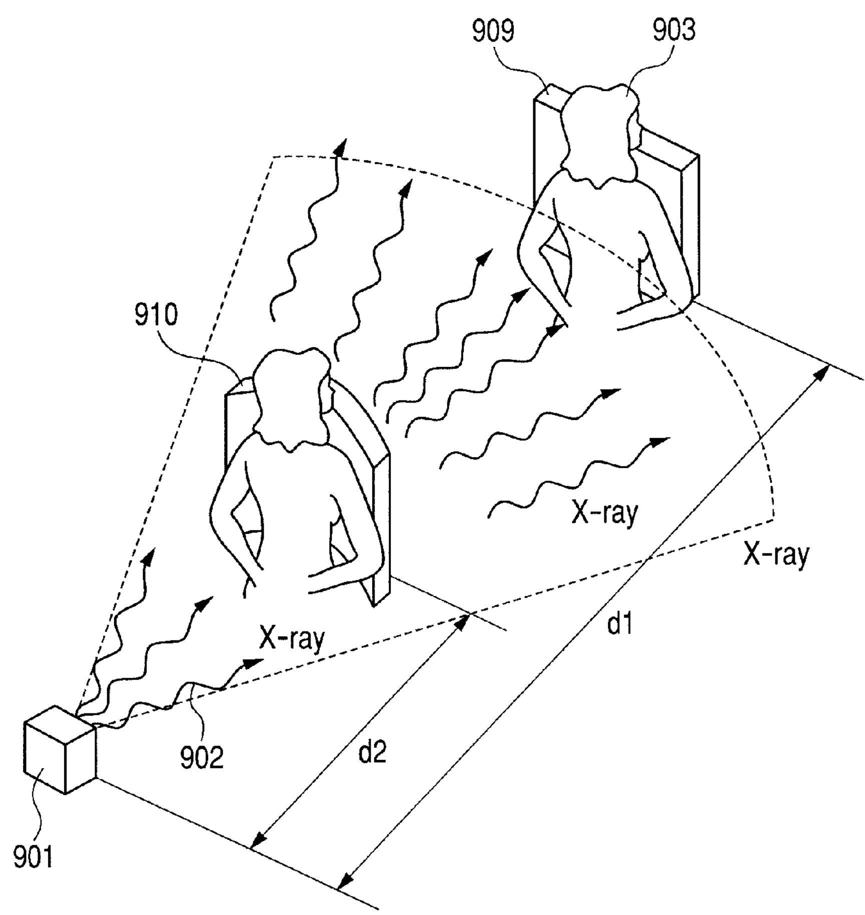
FIG. 19 is a schematic diagram illustrating the radiation detecting apparatus having a curved surface which is the third application example of the present invention.

FIG. 19 is a schematic diagram illustrating the radiation detecting apparatus having a curved surface which is the third application example of the present invention.

Figure 20A:
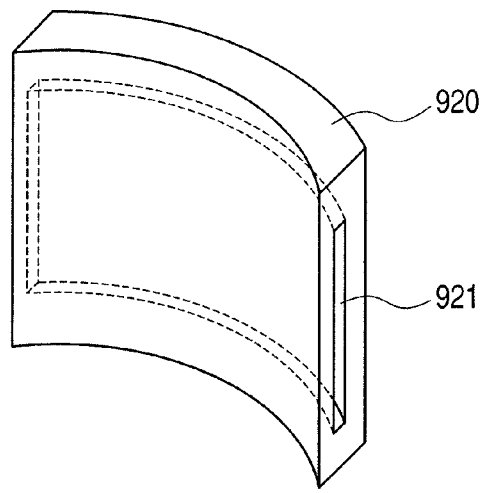
FIGS. 20A, 20B and 20C are diagrams illustrating a holding unit holding the radiation detecting apparatus having the curved surface which is the third application example of the present invention.
Figure 20B:
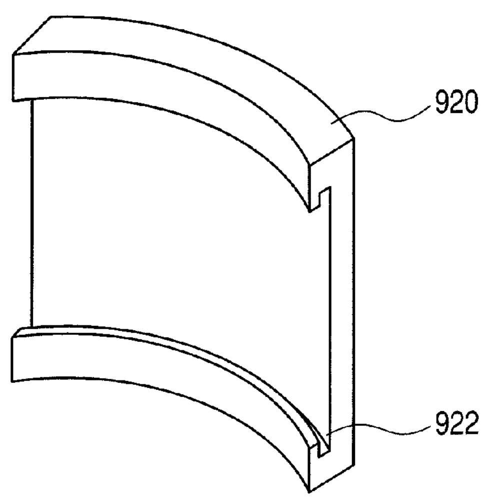
Figure 20C:
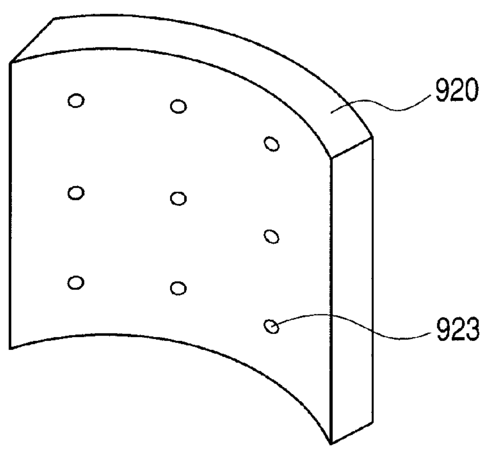

According to the present application example, since the radiation detecting panel has flexibility, the radiation detecting apparatus can be curved. In general, since an X-ray source 901 is a point light source, X-ray 902 spreads out in a fan-like form as illustrated in the figure. Conventionally, a distance d1 between the X-ray source 901, and an object 903 and a radiation detecting apparatus 909 is set long enough so that the X-ray spread out in a fun-like form enters the radiation detecting apparatus 909 almost vertically to decrease distortion of an image. On the other hand, in a case where the radiation detecting apparatus 910 has a curved surface, since the apparatus can be made to be curved in accordance with a spread of the X-ray, the X-ray 902 enters the radiation detecting apparatus 910 almost vertically, even when the distance between the X-ray source 901 and the radiation detecting apparatus 910 is short. That is, the radiation detecting panel according to the present invention can be applied to the radiation detecting apparatus having a curved surface so that the distance between the X-ray source and the radiation detecting apparatus can be decreased to a distance d2 and a space for a checkup can be also decreased. Further, in order to generate a good image, when the apparatus is curved, it is necessary to keep the apparatus in a certain shape. Therefore, as illustrated in FIGS. 20A to 20C, a supporting unit 920 for holding the radiation detecting apparatus can be used. The supporting unit 920 illustrated in FIG. 20A is a case including a curved recessed portion 921, into which the radiation detecting apparatus is inserted and held. A material having enough rigidity for maintaining a shape of the curved radiation detecting apparatus and absorbing less radiation can be used for a material of the supporting unit. Resin such as acrylic can be used. The supporting unit 920 illustrated in the FIG. 20B is a member including guide rails 922 arranged at two sides facing each other, and the radiation detecting apparatus is inserted along the guide rails and held. When this structure is used, unlike the structure illustrated in FIG. 20A, since a radiation-entering side of the radiation detecting apparatus is opened, transparent resin or metal is used for a material of the supporting unit. In FIG. 20C, the supporting unit 920 includes a vacuum apparatus (not illustrated) to vacuum up the radiation detecting apparatus through openings 923 and retains the apparatus by pressure. When this structure is adopted, similar to FIG. 20B, resin or metal is also used for a material of a supporting unit. Additionally, the supporting unit 920 can include a magnet so that the radiation detecting apparatus can be held by a magnetic force. The radiation detecting apparatus can be fixed by a supporting unit to stabilize a position thereof, if the radiation detecting apparatus is to be fixed at each engaged part. There is a method of fixing the engaged part by an engaging hook provided at the supporting unit and an engaged groove provided at the radiation detecting apparatus.

Seventh Embodiment

Figure 21:
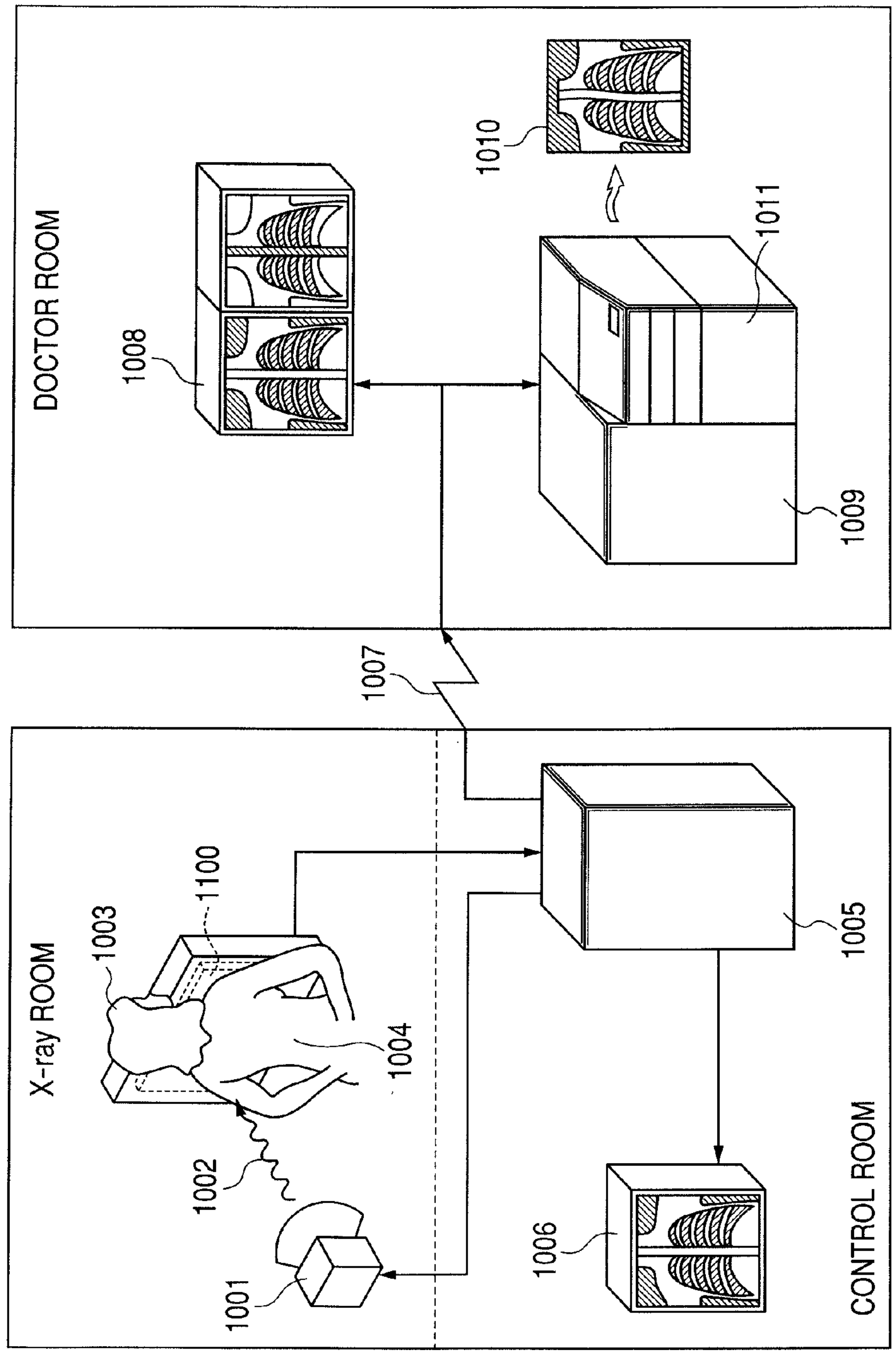
FIG. 21 is a diagram illustrating a case where the radiation detecting apparatus which is a forth application example of the present invention is applied to the radiation imaging system.

FIG. 21 is a diagram illustrating an application example in which the radiation detecting apparatus of the present invention is applied to a radiation imaging system. The radiation imaging system includes the radiation detecting apparatus, and at least one of a radiation source, signal processing unit, display unit, transmission unit, and storing unit.

Radiation 1002 generated in a radiation tube 1001 (which is the radiation source) transmits a body part 1004 such as a chest of an object (patient) 1003 and enters a radiation detecting apparatus 1100 mounting scintillator at an upper portion thereof. The incident radiation (or light) 1002 includes information on the inside of the body of the patient 1003. In the radiation detecting apparatus 1100, the scintillator is emitted in accordance with the incident radiation 1002, and photoelectrically converted to obtain electrical information. In the radiation detecting apparatus 1100, the radiation 1002 may also be directly converted into an electrical charge to obtain electrical information. The information is digitally converted and image processed by an image processor 1005 as a signal processing unit to be displayed on a display 1006 as a display unit provided in a control room.

Further, this information can be transferred to a remote area by wireless transmission or a wired transmission unit 1007 such as a telephone line. Thus, the information can be displayed on the display 1008 served as the display unit provided a doctor room at other place, or stored in a recording medium such as an optical disk and a semiconductor memory by a data storage 1009 served as a storing unit, which enables a doctor to give a diagnosis from a local area. Furthermore, the data storage 1009 is connected to a laser printer 1011 served as a printing unit to store information transmitted by a transmission unit 1007 in a recording medium such as a film 1010.

As many apparently widely different embodiments of the present invention can be made without departing from the spirit and scope thereof, it is to be understood that the invention is not limited to the specific embodiments thereof except as defined in the claims.

This application claims the benefit of Japanese Patent Application No. 2007-287402, filed Nov. 5, 2007, and Japanese Patent Application No. 2008-273193, filed Oct. 23, 2008, which are hereby incorporated by reference herein in their entirety.

The invention claimed is:

1. A manufacturing method of a radiation detecting apparatus comprising steps of:

preparing a matrix array comprising a substrate, an insulating layer arranged on the substrate, a plurality of pixels arranged on the insulating layer, and a connection electrode for connecting to an external circuit arranged at a periphery of the plurality of pixels, wherein the pixel includes a conversion element converting an incident radiation or light into an electric signal;

fixing a flexible supporting member for covering the plurality of pixels and the connection electrode to the matrix array at a side opposite to the substrate; and releasing the substrate from the matrix array.

2. The manufacturing method of a radiation detecting apparatus according to claim 1, wherein the flexible supporting member is a first electromagnetic shielding layer, in the step of fixing the flexible supporting member, a first scintillator layer is fixed on the plurality of pixels, the first electromagnetic shielding layer is fixed on the first scintillator layer to form a stacked-layer structure wherein the plurality of pixels, the first scintillator layer and the first electromagnetic shielding layer are laminated in this order.

3. The manufacturing method of a radiation detecting apparatus according to claim 2, further comprising a step of:

fixing a second scintillator layer on a surface of the insulating layer at a side thereof from which the substrate is released.

4. The manufacturing method of a radiation detecting apparatus according to claim 3, wherein a distance between the conversion element and the second scintillator layer is 100 nm-50 micron.

5. The manufacturing method of a radiation detecting apparatus according to claim 2, further comprising a step of:

fixing a second scintillator layer on a surface of the insulating layer at a side thereof from which the substrate is released, and fixing a second electromagnetic shielding layer on the second scintillator layer.

6. The manufacturing method of a radiation detecting apparatus according to claim 2, further comprising a step of:

fixing a second scintillator layer and a second electromagnetic shielding layer preliminarily fixed to the second scintillator layer on a surface of the insulating layer at a side thereof from which the substrate is released.

7. The manufacturing method of a radiation detecting apparatus according to claim 2, further comprising:

a step of connecting electrically the first electromagnetic shielding layer to a ground electrode of the external circuit.

8. The manufacturing method of a radiation detecting apparatus according to claim 1, wherein the flexible supporting member is a first electromagnetic shielding layer, in the step of fixing the flexible supporting member, a first scintillator layer and the first electromagnetic shielding layer preliminarily fixed to the first scintillator layer are fixed on the plurality of pixels, to form a stacked-layer structure wherein the plurality of pixels, the first scintillator layer and the first electromagnetic shielding layer are laminated in this order.

9. The manufacturing method of a radiation detecting apparatus according to claim 8, further comprising:

a step of connecting electrically the first electromagnetic shielding layer to a ground electrode of the external circuit.

10. The manufacturing method of a radiation detecting apparatus according to claim 1, wherein the flexible supporting member is a first scintillator layer, in the step of fixing the flexible supporting member, a scintillator layer is fixed on the plurality of pixels, a first electromagnetic shielding layer having a metal layer is fixed on the first scintillator layer to form a stacked-layer structure wherein the plurality of pixels, the first scintillator layer and the first electromagnetic shielding layer are laminated in this order.

11. The manufacturing method of a radiation detecting apparatus according to claim 10, further comprising:

a step of connecting electrically the first electromagnetic shielding layer to a ground electrode of the external circuit.

12. The manufacturing method of a radiation detecting apparatus according to claim 1, wherein the flexible supporting member is a first scintillator layer, in the step of fixing the flexible supporting member, a first scintillator layer and a first electromagnetic shielding layer having a metal layer preliminarily fixed to the first scintillator layer are fixed on the plurality of pixels, the first electromagnetic shielding layer is fixed on the first scintillator layer to form a stacked-layer structure wherein the plurality of pixels, the first scintillator layer and the first electromagnetic shielding layer are laminated in this order.

13. The manufacturing method of a radiation detecting apparatus according to claim 12, further comprising:

a step of connecting electrically the first electromagnetic shielding layer to a ground electrode of the external circuit.

14. The manufacturing method of a radiation detecting apparatus according to claim 1, further comprising a step of:

connecting the connection electrode to the external circuit.

15. The manufacturing method of a radiation detecting apparatus according to claim 14, wherein the flexible supporting member covers further at least a part of the external circuit.

16. The manufacturing method of a radiation detecting apparatus according to claim 14, wherein the connecting the connection electrode is conducted from a side of the insulating layer, after the step of releasing the substrate.

17. The manufacturing method of a radiation detecting apparatus according to claim 1, further comprising:

a step of fixing a flexible light source to a side of the flexible array, from which the substrate is released, and opposite to a side of the flexible supporting member.

18. A radiation detecting apparatus comprising:

a flexible matrix array comprising an insulating layer, a plurality of pixels arranged on the insulating layer, and a connection electrode for connecting to an external circuit arranged at a periphery of the plurality of pixels, wherein the pixel includes a conversion element converting an incident radiation or light into an electric signal; and a flexible supporting member covering the plurality of pixels and the connection electrode, and being arranged at a side of the flexible matrix array facing the plurality of pixels.

19. The radiation detecting apparatus according to claim 18, wherein the flexible supporting member includes a first electromagnetic shielding layer having a metal layer.

20. The radiation detecting apparatus according to claim 19, further comprising:

a first scintillator layer arranged between the first electromagnetic shielding layer and the plurality of pixels.

21. The radiation detecting apparatus according to claim 20, further comprising:

a second scintillator layer arranged to form a stacked-layer structure wherein the second scintillator layer, the flexible matrix array, the first scintillator layer and the first electromagnetic shielding layer are stacked in this order.

22. The radiation detecting apparatus according to claim 21, wherein a distance between the conversion element and the second scintillator layer is 100 nm-50 micron.

23. The radiation detecting apparatus according to claim 18, wherein the flexible supporting member includes a first scintillator layer.

24. The radiation detecting apparatus according to claim 18, further comprising:

the external circuit connected electrically to the connection electrode, wherein the flexible supporting member covers further at least a part of the external circuit.

25. The radiation detecting apparatus according to claim 24, wherein the first electromagnetic shielding layer is electrically connected to a ground electrode of the external circuit.

26. The radiation detecting apparatus according to claim 18, further comprising a flexible light source arranged on a side of the flexible matrix array opposite to a side of the flexible supporting member.

27. The radiation detecting apparatus according to claim 18, wherein the conversion element converts the incident radiation into the electric signal directly, and the flexible supporting member is an insulating layer.

28. A radiation imaging apparatus comprising:

a radiation detecting apparatus according to claim 18;

a signal processing unit for processing a signal from the radiation detecting apparatus;

a recording unit for recording a signal from the signal processing unit;

a display unit for displaying the signal from the signal processing unit;

a transfer unit for transferring the signal from the signal processing unit; and a radiation generating source for generating the radiation.

* * * * *